United States Patent
Malinowski et al.

(10) Patent No.: US 11,462,632 B2
(45) Date of Patent: Oct. 4, 2022

(54) LATERAL BIPOLAR JUNCTION TRANSISTOR DEVICE AND METHOD OF MAKING SUCH A DEVICE

(71) Applicant: GLOBALFOUNDRIES U.S. Inc., Santa Clara, CA (US)

(72) Inventors: Arkadiusz Malinowski, Dresden (DE); Alexander M. Derrickson, Saratoga Springs, NY (US); Ali Razavieh, Saratoga Springs, NY (US); Halting Wang, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 29 days.

(21) Appl. No.: 17/130,121

(22) Filed: Dec. 22, 2020

(65) Prior Publication Data
US 2022/0199810 A1    Jun. 23, 2022

(51) Int. Cl.
| H01L 29/735 | (2006.01) |
| H01L 29/08  | (2006.01) |
| H01L 29/66  | (2006.01) |
| H01L 29/10  | (2006.01) |

(52) U.S. Cl.
CPC ........ *H01L 29/735* (2013.01); *H01L 29/0808* (2013.01); *H01L 29/0821* (2013.01); *H01L 29/1008* (2013.01); *H01L 29/6625* (2013.01)

(58) Field of Classification Search
CPC .............. H01L 29/735; H01L 29/0808; H01L 29/0821; H01L 29/1008; H01L 29/6625
See application file for complete search history.

(56) References Cited

U.S. PATENT DOCUMENTS

| 5,102,812 A | * | 4/1992 | Caneau ............ H01L 21/30612 |
|             |   |        | 438/494 |
| 7,897,995 B2 |   | 3/2011 | Yang et al. |
| 8,310,027 B2 |   | 11/2012 | Russ et al. |
| 8,759,943 B2 |   | 6/2014 | Tseng et al. |
| 9,209,202 B2 |   | 12/2015 | Ponoth et al. |
| 9,219,068 B2 |   | 12/2015 | Cheng et al. |

(Continued)

FOREIGN PATENT DOCUMENTS

EP    0642170 B1    12/1997

OTHER PUBLICATIONS

Non Final Office Action dated Apr. 25, 2022 for U.S. Appl. No. 17/177,490, filed Feb. 17, 2021; pp. 12.

(Continued)

*Primary Examiner* — Syed I Gheyas
(74) *Attorney, Agent, or Firm* — Francois Pagette; Hoffman Warnick LLC

(57) ABSTRACT

A non-uniform base width bipolar junction transistor (BJT) device includes: a semiconductor substrate, the semiconductor substrate having an upper surface; and a BJT device, the BJT device comprising a collector region, a base region, and an emitter region positioned in the semiconductor substrate, the base region being positioned between the collector region and the emitter region; the base region comprising a top surface and a bottom surface, wherein a first width of the top surface of the base region in a base width direction of the BJT device is greater than a second width of the bottom surface of the base region in the base width direction of the BJT device.

16 Claims, 24 Drawing Sheets

(56) References Cited

U.S. PATENT DOCUMENTS

| | | |
|---|---|---|
| 9,263,583 B2 | 2/2016 | Cai et al. |
| 9,608,059 B2 | 3/2017 | Cappellani et al. |
| 9,786,765 B2 | 10/2017 | Nowak et al. |
| 9,842,897 B2 | 12/2017 | Akarvardar et al. |
| 10,312,327 B2 | 6/2019 | Chang et al. |
| 2003/0025125 A1 | 2/2003 | Menut et al. |
| 2009/0045467 A1 | 2/2009 | Kakoschke et al. |
| 2018/0158957 A1 | 6/2018 | Rachmady et al. |

OTHER PUBLICATIONS

Notice of Allowance and Fee(s) Due dated May 13, 2022 for U.S. Appl. No. 17/177,490, filed Feb. 17, 2021; p. 15.

\* cited by examiner

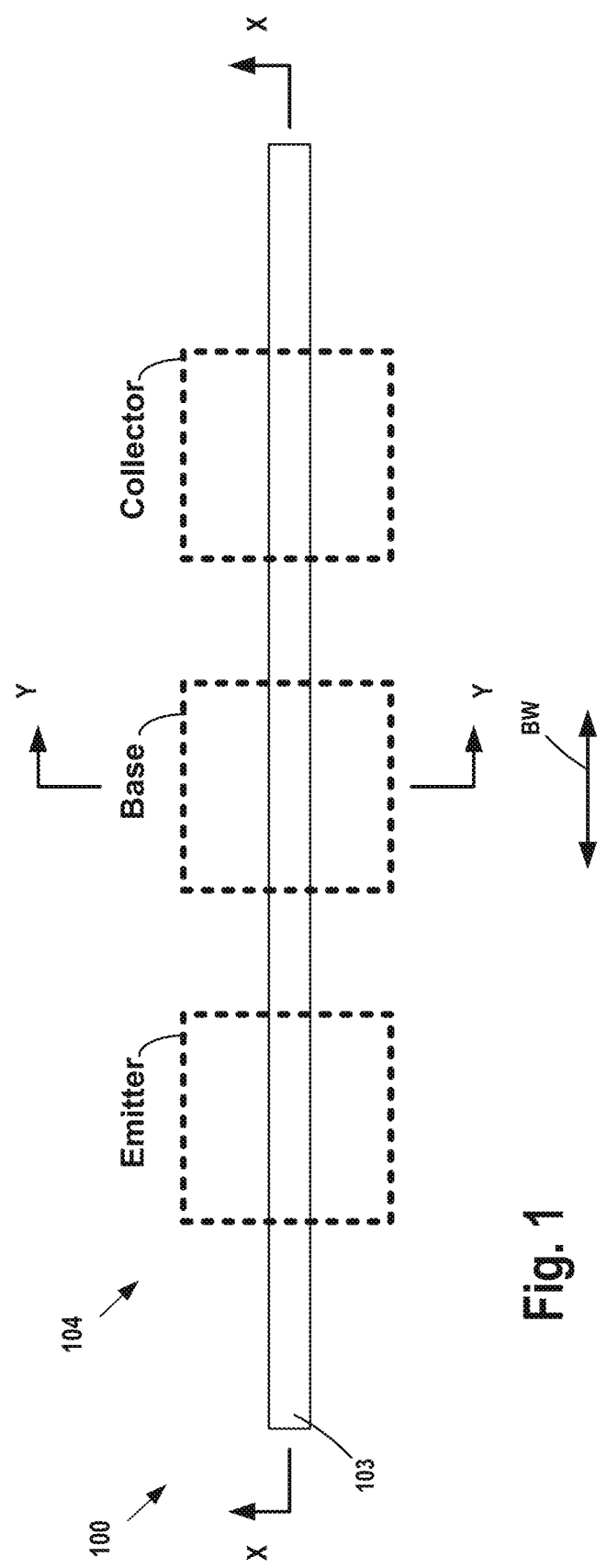

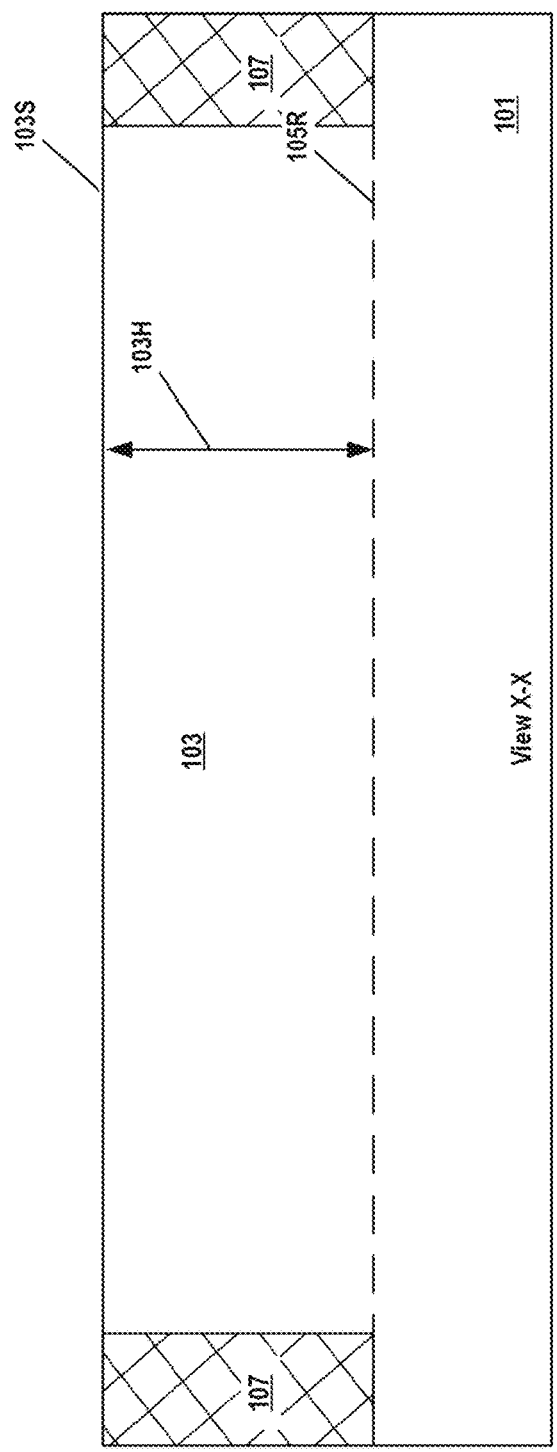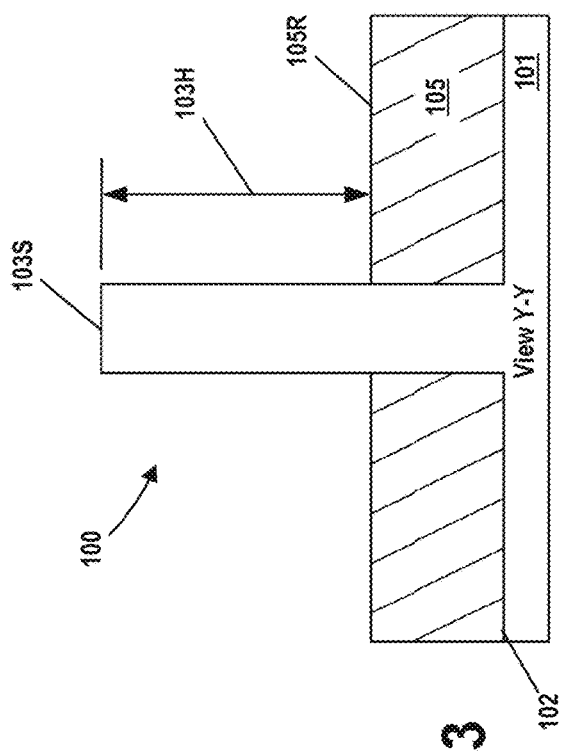

LATERAL BIPOLAR JUNCTION TRANSISTOR DEVICE AND METHOD OF MAKING SUCH A DEVICE

FIELD OF THE DISCLOSURE

Generally, the present disclosure relates to various novel embodiments of a lateral bipolar junction transistor (BJT) device and various novel methods of making such a lateral BJT device.

BACKGROUND

Bipolar junction transistor (BJT) devices are widely used in many integrated circuit products. In general, a BJT device comprises a collector region, a base region, and an emitter region. The BJT device may be either an PNP device or an NPN device. In a PNP BJT device, current flows from the emitter to the base and exits the BJT device via the collector. In an NPN BJT device, current flows from the collector to the base and exits the BJT device via the emitter. Device designers are under constant pressure to increase the operating speed and electrical performance of BJT devices and integrated circuit products that employ such BJT devices.

A system-on-a-chip (SoC) is an integrated circuit product that includes all of the components needed for a system, e.g., a computer. Such an SOC chip may include one or more central processors and co-processors, graphics drivers, memory, power management circuits, wireless communication interfaces, and other parts of a fully functional system. Further, because the signals among the various components on the SoC are kept on-die, power requirements of the system on the SoC can be reduced. SoC devices may be formed using BiCMOS technology, which involves the formation of both BJT devices and CMOS field effect transistors (N-type and P-type) on a single chip. Techniques are needed to effectively and efficiently form BJT devices and CMOS transistors in BiCMOS technology applications.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various novel embodiments of a lateral bipolar junction transistor (BJT) device and various novel methods of making such a lateral BJT device.

One illustrative device disclosed herein according to embodiments includes: a semiconductor substrate, the semiconductor substrate having an upper surface; and a bipolar junction transistor (BJT) device, the BJT device comprising a collector region, a base region, and an emitter region positioned in the semiconductor substrate, the base region being positioned between the collector region and the emitter region; the base region comprising a top surface and a bottom surface, wherein a first width of the top surface of the base region in a base width direction of the BJT device is greater than a second width of the bottom surface of the base region in the base width direction of the BJT device.

A lateral bipolar junction transistor (BJT) device according to embodiments includes: a collector region, a base region, and an emitter region positioned in a semiconductor substrate, the base region being positioned between the collector region and the emitter region; the base region comprising a top surface and a bottom surface, wherein a first width of the top surface of the base region in a base width direction of the lateral BJT device is greater than a second width of the bottom surface of the base region in the base width direction of the lateral BJT device, wherein a section of the collector region and a section of the emitter region extend under portions of the base region and are separated by a distance equal to the second width.

A method according to embodiments includes: providing a semiconductor substrate, the semiconductor substrate having an upper surface; and forming a bipolar junction transistor (BJT) device in the semiconductor substrate, the BJT device comprising a collector region, a base region, and an emitter region positioned in the semiconductor substrate, the base region being positioned between the collector region and the emitter region and including a top surface and a bottom surface, wherein a first width of the top surface of the base region in a base width direction of the BJT device is greater than a second width of the bottom surface of the base region in the base width direction of the BJT device.

BRIEF DESCRIPTION OF THE DRAWINGS

The disclosure may be understood by reference to the following description taken in conjunction with the accompanying drawings, in which like reference numerals identify like elements, and in which:

FIGS. 1-27 depict various novel embodiments of a lateral bipolar junction transistor (BJT) device and various novel methods of making such a lateral BJT device. The drawings are not to scale.

Figure 4:
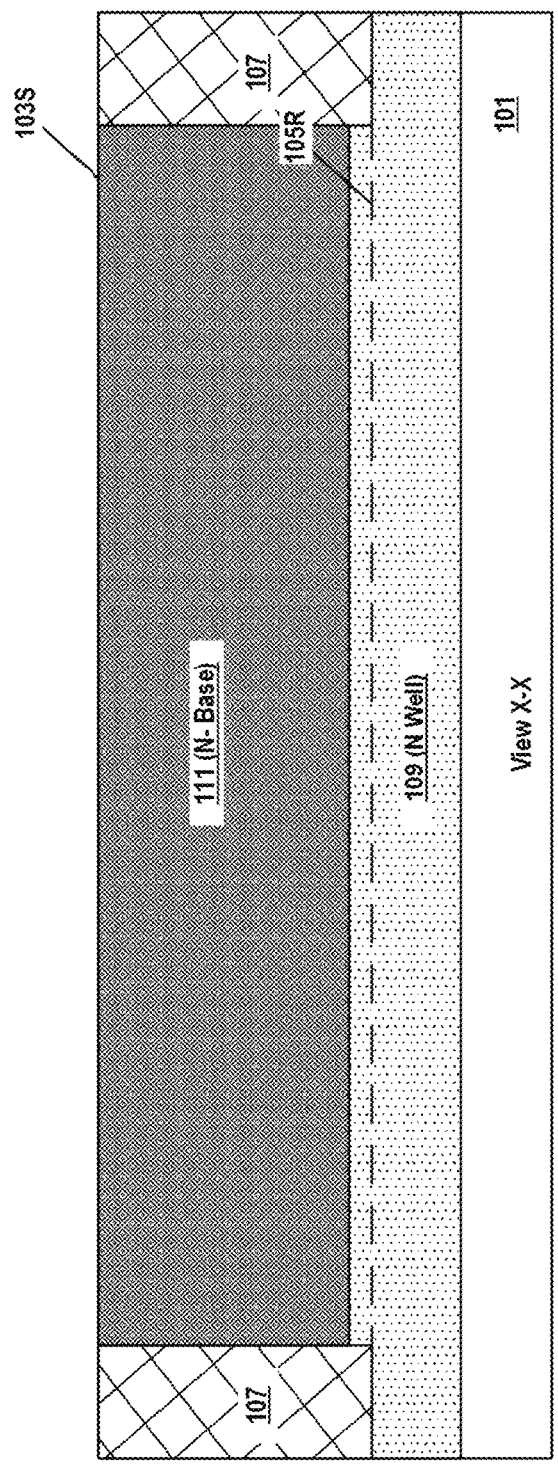

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

FIGS. 1-27 depict an integrated circuit (IC) product 100 that comprises one or more lateral BJT devices 104 on a semiconductor substrate 101. In one illustrative example, the IC product 100 may also comprise CMOS-based integrated circuits that comprise both NFET and PFET transistors (not shown) that are formed on the semiconductor substrate 101. The NFET and PFET transistors may be of any configuration, e.g., FinFET devices, planar devices, etc. As will be appreciated by those skilled in the art after a complete reading of the present application, the various process flows disclosed herein are compatible with various process flows that a performed to form such CMOS-based integrated circuits. Additionally, the lateral BJT device 104 disclosed herein may be either an NPN device or a PNP device. In the examples depicted herein, the BJT device 104 will be a PNP device. Moreover, in the examples depicted herein, the lateral BJT device 104 will be formed in a fin structure 103. However, the presently disclosed subject matter should not be considered to be limited to such fin-based structures.

FIG. 1 is a simplistic plan view of one illustrative embodiment of an IC product 100 disclosed herein. The lateral BJT device 104 will be formed in an illustrative fin structure 103. The lateral BJT device 104 comprises an emitter region (E), a base region (B), and a collector region (C). The base width (BW) direction of the lateral BJT device 104 and the location where various cross-sectional views presented in the attached drawings are taken are also depicted in FIG. 1. More specifically, the cross-sectional view "X-X" is taken along the fin structure 103 in a direction corresponding to the base width direction, i.e., along the long axis of the fin structure 103. The view "Y-Y" is taken in a direction that is transverse to the base width direction, i.e., transverse to the long axis of the fin structure 103. Although the lateral BJT device 104 is depicted as being formed above a single fin 103, the lateral BJT device 104 can comprise any desired number of fins.

In the depicted examples, and with reference to FIG. 2, the lateral BJT device 104 of the IC product 100 will be formed above a semiconductor substrate 101. The substrate 101 may have a variety of configurations, such as a bulk semiconductor substrate depicted herein, or it may take the form of a semiconductor-on-insulator (SOI) substrate. Such an SOI substrate includes a base semiconductor layer, a buried insulation layer positioned on the base semiconductor layer, and an active semiconductor layer positioned above the buried insulation layer. In some applications, the substrate 101 may be made of silicon or it may be made of semiconductor materials other than silicon. Thus, the terms "substrate" or "semiconductor substrate" should be understood to cover all semiconductor materials and all forms of such materials. Moreover, in some cases, the substrate 101 may comprise an N-type or P-type dopant material. In the example depicted herein, the substrate 101 will be assumed to be doped with a P-type dopant.

FIGS. 2 (view X-X) and 3 (view Y-Y) depict the IC product 100 after several process operations were performed. First, the fin 103 was formed by performing known manufacturing process operations. As a practical matter, many other fins (not shown) would be formed in the substrate 101 at the same time as the depicted fin 103. However, for purposes of explanation, only the formation of the single depicted fin 103 will be discussed. For example, the fin 103 may be formed by performing one or more etching processes, e.g., anisotropic etching processes, through a patterned fin-formation etch mask (not shown) to form a plurality of fin-formation trenches 102 (see FIG. 3) in the substrate 101 and thereby define the fin 103. The width and height of the fin 103 may vary depending upon the particular application. Additionally, the overall size, shape, and configuration of the fin- formation trenches 102 and fin 103 may vary depending on the particular application. In the examples depicted herein, the fin 103 will be simplistically depicted as having a rectangular cross-sectional configuration having a substantially uniform thickness throughout the height of the fin 103. In a real-world device, the fin 103 may have a tapered cross-sectional configuration, wherein the width of the upper surface 103S of the fin 103 (i.e., the top critical dimension) shown in FIG. 3 is less than the width of the of the bottom of the fin 103. Additionally, the axial length of the fin 103 may also vary depending upon the particular application. Of course, the physical dimensions of the fin 103 may change depending upon the particular application and upon advances in technology.

Next, a recessed layer of insulating material 105 e.g., silicon dioxide, with a recessed upper surface 105R was formed adjacent the fin 103 by performing traditional manufacturing techniques. The layer of insulating material 105 was initially deposited and the upper surface of the layer of insulating material 105 was thereafter planarized. At that point a recess etching process was performed to remove a portion of the vertical thickness of the layer on insulating material 105 until the final desired thickness was reached. This is sometimes referred to as the "fin reveal" process, as it exposes a desired vertical height 103H of the fin 103 above the recessed upper surface 105R of the layer of insulation material 105. Thereafter, an isolation structure 107 was formed in the fin 103 by performing known manufacturing techniques. The isolation structure 107 may be comprised of any insulating material, e.g., silicon dioxide.

Figure 5:
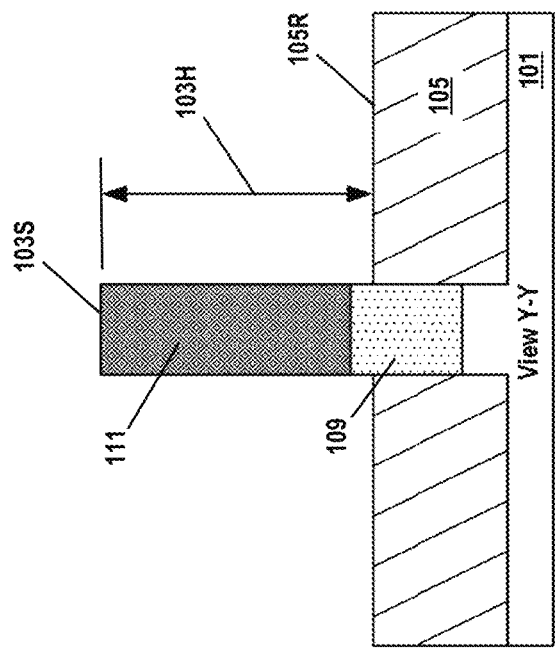

FIGS. 4 and 5 depict the IC product 100 after several process operations were performed. First, an ion implantation process was performed to form a N well region 109 in the semiconductor substrate 101. The dopant concentration of N-type dopant material in the N well region 109 may vary depending upon the particular application, e.g., $1e^{14}$–$1e^{16}$ atoms/cm$^3$. In one particular embodiment, the dopant concentration of N-type dopant material in the N well region 109 may be about $1e^{15}$ atoms/cm$^3$. The N well region 109 may be doped with any species of N-type dopant material. Next, another ion implantation process was performed form an N$^-$ implant region 111 within the N well region 109. As will be appreciated by those skilled in the art after a complete reading of the present application, the N$^-$ implant region 111 will be the base region of the lateral BJT device 104. The dopant concentration of N-type dopant material in the N$^-$ implant region 111 may vary depending upon the particular application, e.g., $1e^{16}$–$1e^{18}$ atoms/cm$^3$. In one particular embodiment, the dopant concentration of N-type dopant material in the N$^-$ implant region 111 may be about $1e^{17}$ atoms/cm$^3$. The N$^-$ implant region 111 may be doped with any species of N-type dopant material. The N$^-$ implant region 111 and the N well region 109 need not be doped with the same species of N-type dopant material, but that may be the case in some applications.

Figure 6:
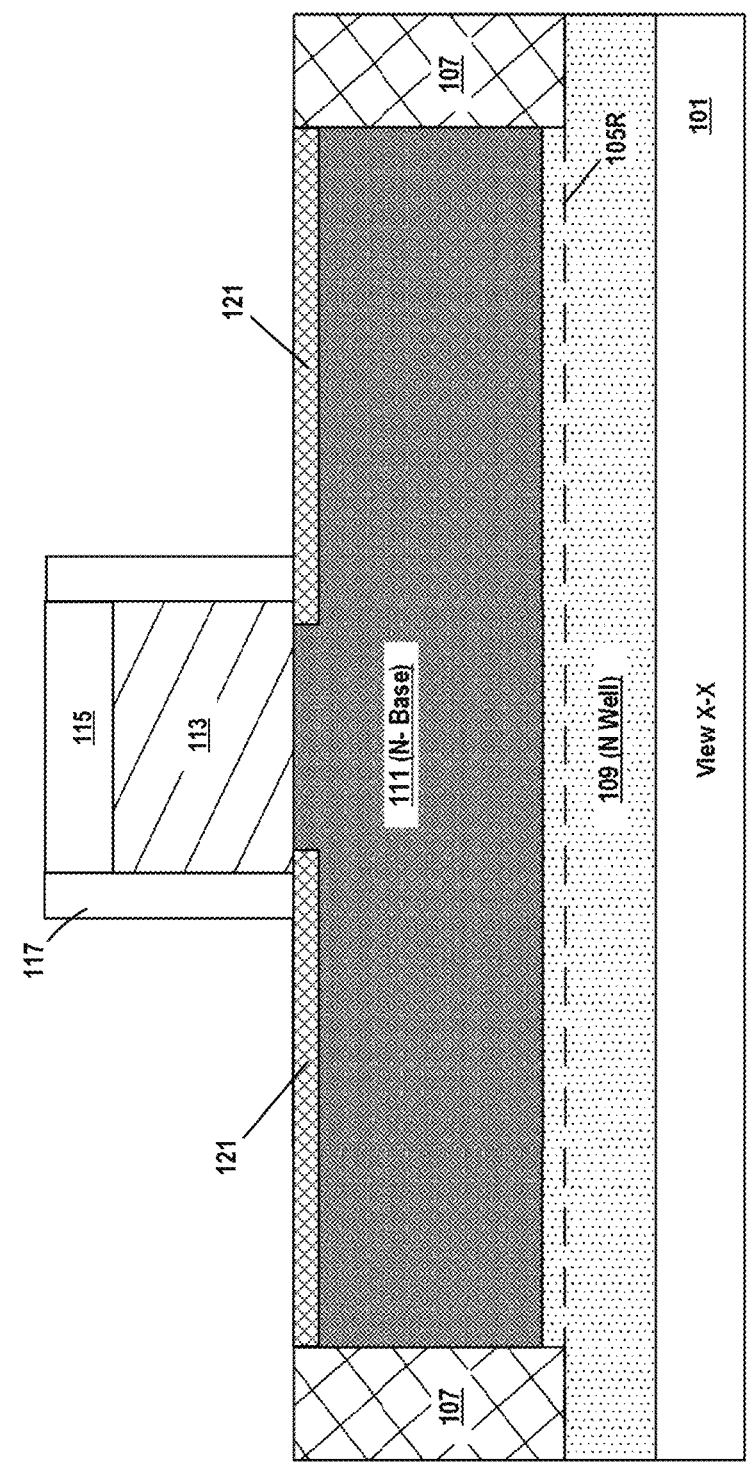

FIG. 6 depicts the IC product 100 after several process operations were performed. In one illustrative process flow, a portion of the base region of the lateral BJT device 104 may be formed by making use of a sacrificial gate structure 113 that is formed above the N$^-$ implant region 111 as part of the process operations that are performed to make final gate structures (not shown) for various transistor devices (not shown) using known replacement gate manufacturing techniques. Also depicted in FIG. 6 are a gate cap 115 and a sidewall spacer 117. Various process flows may be performed to form these structures. In one illustrative process flow, the material for the sacrificial gate structure 113 as well as the material for the gate cap 115 may be blanket deposited above the substrate 101. Thereafter, one or more masking and etching processes may be performed on these deposited materials so as to form the sacrificial gate structure 113 with the gate cap 115 positioned there above. Next, the simplistically depicted sidewall spacer 117 may be formed adjacent to the substantially vertically oriented sidewalls of the sacrificial gate structure 113. Although only a single sidewall spacer 117 is depicted in the drawings, there may be multiple sidewall spacers formed adjacent the sacrificial gate structure 113 as processing proceeds. In one example, the sidewall spacer 117 may be formed by performing a conformal deposition process to form a conformal layer of sidewall spacer material on the sacrificial gate structure 113. At that point, an anisotropic etching process may be performed to remove horizontally oriented portions of the layer of spacer material, thereby forming the sidewall spacer 117 that is positioned on or adjacent the substantially vertically oriented sidewalls of the sacrificial gate structure 113. In terms of materials, the sacrificial gate structure 113 typically comprises a sacrificial gate insulation layer (not separately shown), such as silicon dioxide, that is formed on the fin 103 and a sacrificial gate electrode (not separately shown) made of, for example, polysilicon or amorphous silicon, that is formed on the sacrificial gate insulation layer. The gate cap 115 may be comprised of a material such as silicon nitride, and the sidewall spacer 117 may be comprised of a low-k insulating material (k value less than about 3.4).

Still referencing FIG. 6, after formation of the sidewall spacer 117, a lightly doped drain (LDD) ion implantation process was performed to form P$^+$ LDD implant regions 121 within the N$^-$ implant region 111, i.e., within the base region of the lateral BJT device 104. The dopant concentration of P-type dopant material in the P$^+$ LDD implant regions 121 may vary depending upon the particular application, e.g., $1e^{17}$–$1e^{20}$ atoms/cm$^3$. In one particular embodiment, the dopant concentration of P-type dopant material in the P$^+$ LDD implant regions 121 may be about $1e^{19}$ atoms/cm$^3$. The P$^+$ LDD implant regions 121 may be doped with any species of P-type dopant material.

Figure 7:
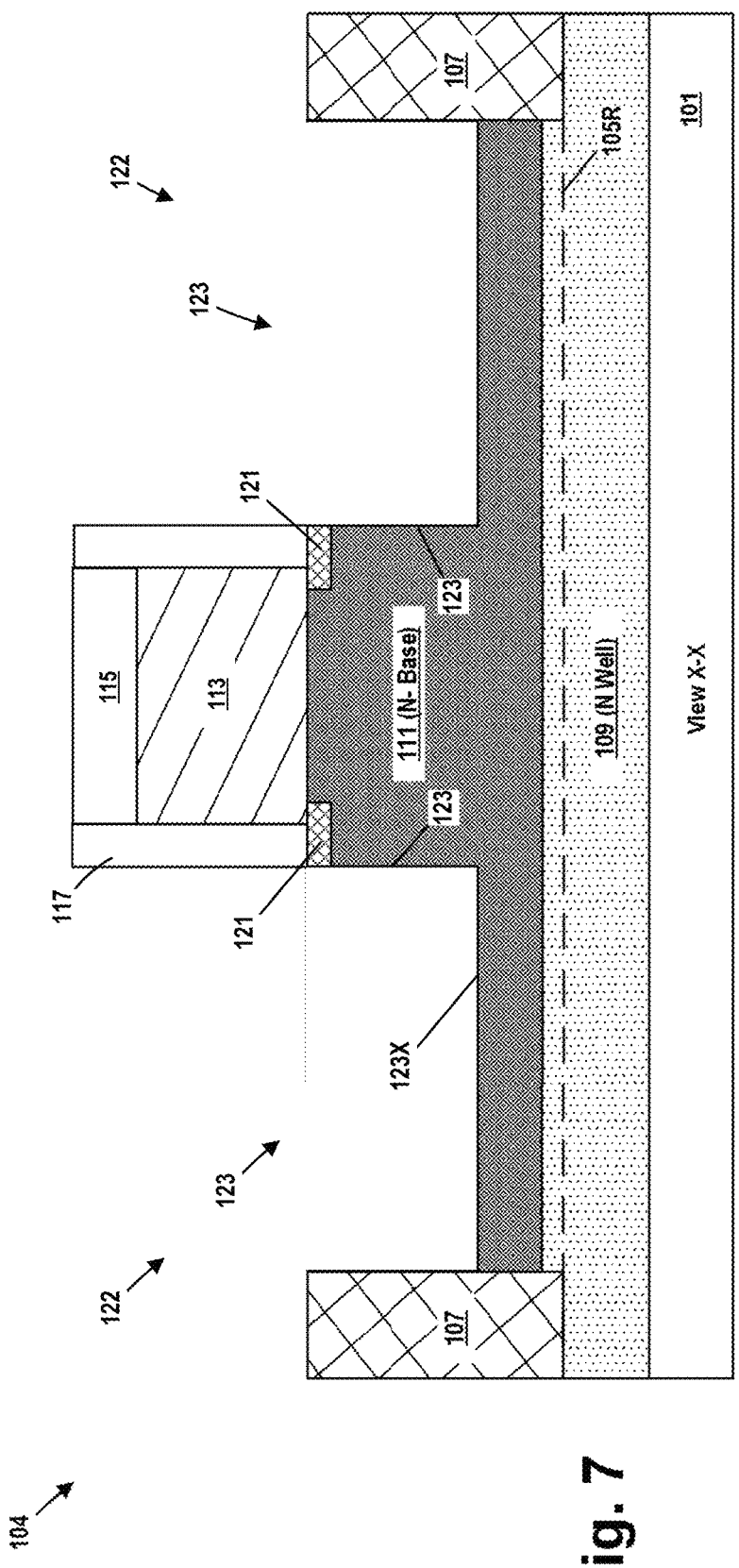

As will be described more fully below, various process operations will be performed to form overall epitaxial cavities 122 in the semiconductor substrate 101 on opposite sides of the gate structure 113 where the emitter region and the collector region of the lateral BJT device 104 will be formed. Each of the overall epitaxial cavities 122 has the same basic configuration. Accordingly, FIG. 7 depicts the IC product 100 after a first etching process, e.g., an anisotropic etching process, was performed to form a plurality of upper epitaxial cavities 123 in the fin 103. The upper epitaxial cavities 123 have a bottom surface 123X that stops within the N$^-$ implant region 111, i.e., within the base region of the lateral BJT device 104, but that may not be the case in all applications. The depth of the upper epitaxial cavities 123 may vary depending upon the particular application. In one illustrative embodiment, based upon current-day technology, the depth of the upper epitaxial cavities 123 below the upper surface 103S of the fin 103 may be about 40-60 nm. In the presently disclosed example, the upper epitaxial cavities 123 are substantially vertically oriented and substantially self-aligned with respect to the adjacent sidewall spacer 117 and the isolation structure 107.

Figure 8:
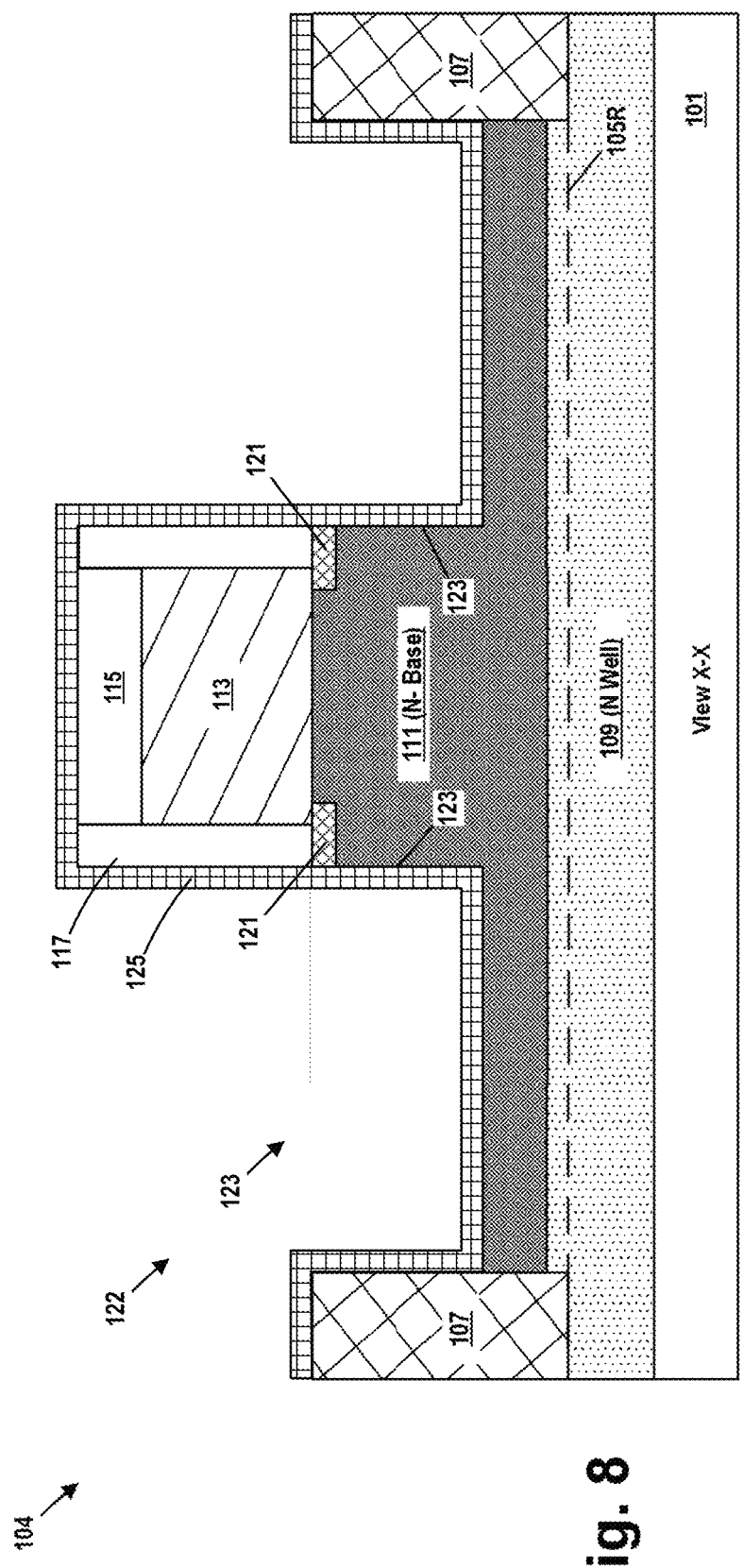
Figure 9:
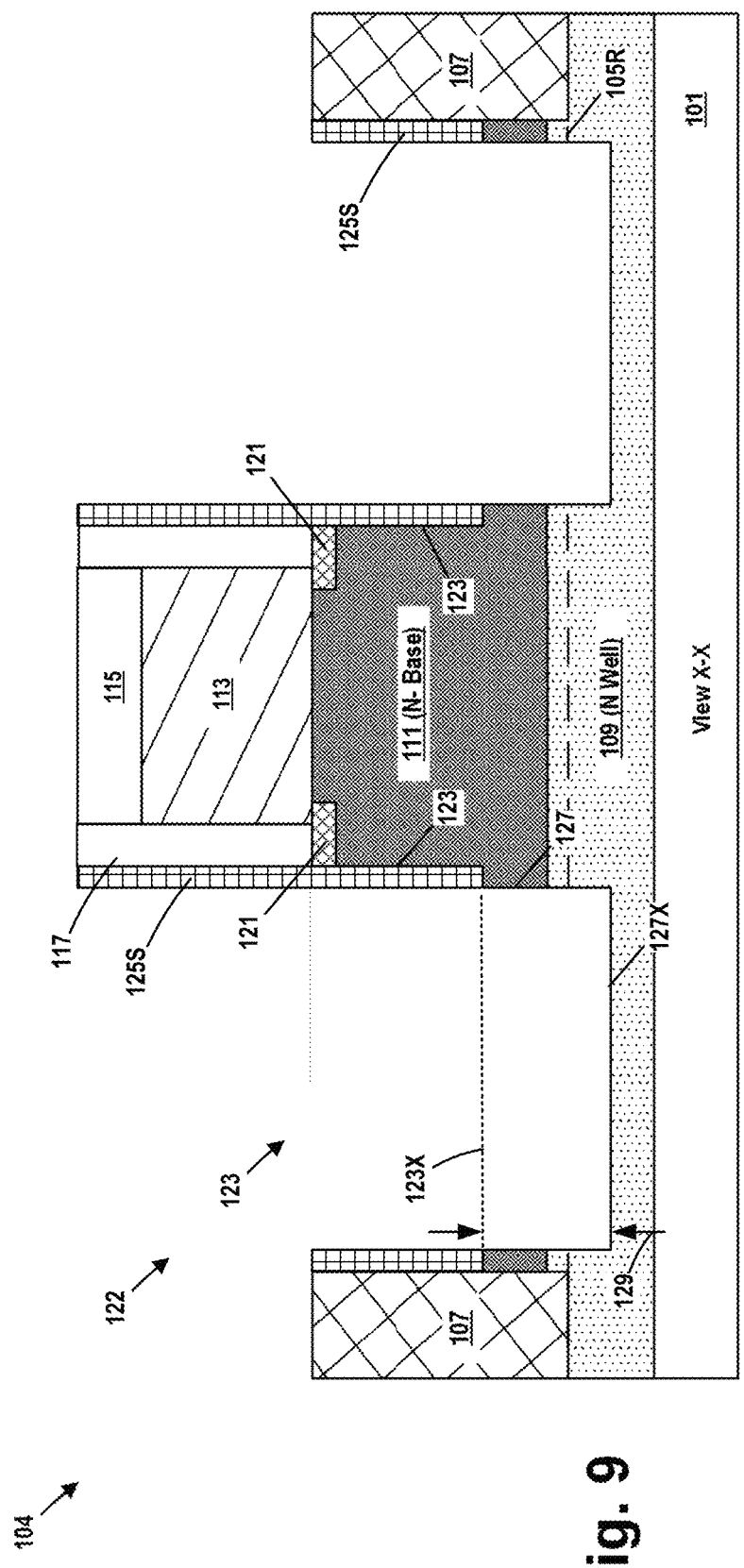

FIG. 8 depicts the IC product 100 after a conformal deposition process was performed to form a conformal layer of insulating material 125 on the product 100 and within the upper epitaxial cavities 123. The conformal layer of insulating material 125 may be comprised of a variety of different materials, e.g., silicon dioxide, silicon nitride, and it may be formed to any desired thickness, e.g., 4-5 nm, based upon current-day technology FIG. 9 depicts the IC product 100 after several process operations were performed. First, an anisotropic etching process was performed on the conformal layer of insulating material 125 so as to remove substantially horizontally oriented portions of the conformal layer of insulating material 125. This operation results in the formation of a sacrificial internal sidewall spacer 125S within each of the upper epitaxial cavities 123. Note that, after formation of the internal sidewall spacer 125S, the bottom surface 123X of each of the upper epitaxial cavities 123 is exposed. Thereafter, after another anisotropic etching process was performed to form another epitaxial cavity 127 below each of the upper epitaxial cavities 123. As depicted, in one illustrative embodiment, the epitaxial cavities 127 are substantially self-aligned with respect to the internal sidewall spacer 125S within each of the upper epitaxial cavities 123, and the epitaxial cavities 127 effectively extend the depth of the upper epitaxial cavities 123. The epitaxial cavities 127 have a bottom surface 127X that is positioned at a level within the substrate 101 below the bottom surface 123X of the upper epitaxial cavities 123. In one illustrative example, the difference 129 in the vertical position of the bottom surface 123X of the upper epitaxial cavities 123 and the bottom surface 127X of the epitaxial cavities 127 may be about 10-20 nm, based upon current-day technology. In the depicted example, the bottom surface 127X of the epitaxial cavities 127 stops within the N well region 109, but that may not be the case in all applications.

Figure 10:
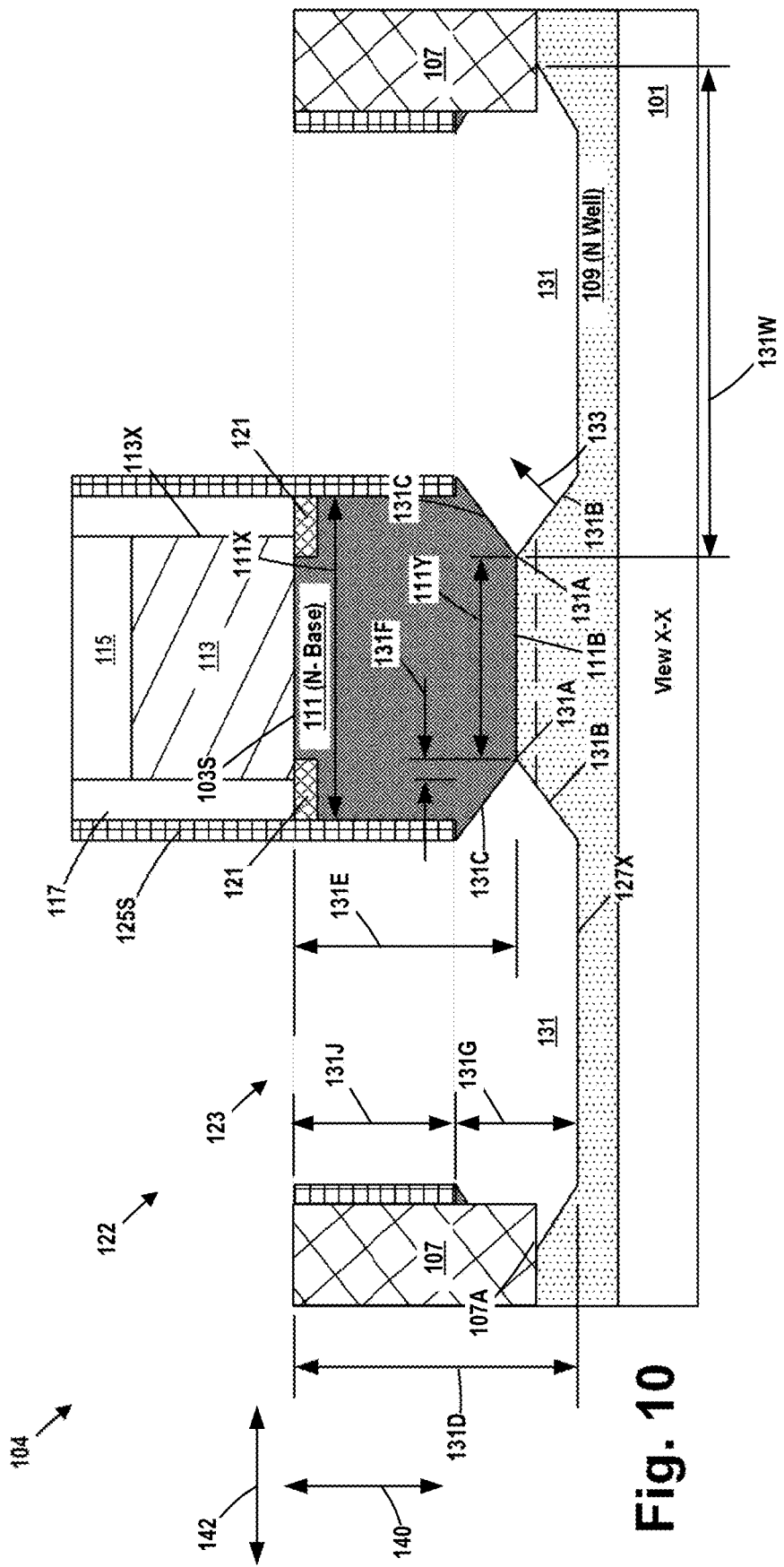

FIG. 10 depicts the IC product 100 after a crystallographic wet etch process was performed. Such an etching process may be performed using an etchant such as TMAH (tetramethylammoniumhydroxide), KOH, etc. This process operation results in the formation of a lower epitaxial cavity 131 at the bottom of each of the upper epitaxial cavities 123. In one illustrative embodiment, the lower epitaxial cavity 131 may have a sigma-shaped (or diamond-shaped) cross-sectional configuration in a cross-section taken through the lower epitaxial cavity 131 in a direction corresponding to the base width direction of the lateral BJT device 104. The silicon substrate 101 has a crystalline structure wherein the <100> crystal direction is indicated by the double arrow 140 and the <110> crystal direction of the substrate 101 is indicated by the double arrow 142. The lower epitaxial cavity 131 is partially defined by a substantially planar bottom surface 127X, a lower faceted surface 131B, and an upper faceted surface 131C. The <111> crystal direction of the substrate 101 is substantially normal to the lower faceted surface 131B and it is indicated by the arrow 133. As will be appreciated by those skilled in the art, such a TMAH or KOH based wet etch process can have a substantially greater etch rate in the <100> crystal direction than in the <111> crystal direction. As depicted, the faceted surfaces 131B and 131C meet at an apex 131A. Of course, as will be appreciated by those skilled in the art after a complete reading of the present application, the overall size and configuration of the lower epitaxial cavities 131 may vary depending upon the particular application and is not limited to the illustrative sigma-shape (or diamond-shape) cross-sectional configuration depicted in FIG. 10, as the lower epitaxial cavities 131 may have a variety of different configurations.

In the depicted example, the upper epitaxial cavity 123 extends from the surface 130S of the fin 103 to the lower epitaxial cavity 131. Each of the overall epitaxial cavities 122 comprises an upper epitaxial cavity 123 and a lower epitaxial cavity 131. The physical size and resulting positioning of the illustrative sigma-shaped lower epitaxial cavities 131 relative to other structures or features on the IC product 100 may vary depending upon the particular application. Accordingly, the following illustrative dimensions are provided only by way of example based upon current-day technology, and such dimensional examples should not be considered to be limitations to the various inventions disclosed herein. The lower epitaxial cavities 131 have an overall width 131W (in the base width direction) and an overall height or vertical thickness 131G. In one illustrative example, the overall width 131W may be about 30-60 nm and the overall height or vertical thickness 131G may be about 10-20 nm. The bottom surface 127X of the lower epitaxial cavities 131 may be positioned a distance 131D of about 50-80 nm below the upper surface 103S of the fin 103. The apex 131A of the lower epitaxial cavities 131 may be positioned a distance 131E of about 45-70 nm below the upper surface 103S of the fin 103. In one particularly illustrative example, the apex 131A of each of the lower epitaxial cavities 131 may extend under the sidewalls 113X of the gate structure 113 by a distance 131F. In one illustrative example, the dimension 131F may be about 1-10 nm. In other applications, the apex 131A of each of the lower epitaxial cavities 131 may not extend under the sidewalls 113X of the gate structure 112 at all. Note that the lateral width of the lower epitaxial cavity 131 in the base with direction of the lateral BJT device 104 is greater than the lateral width of the substantially vertically oriented upper epitaxial cavity 123 in the base with direction of the lateral BJT device 104. The vertical distance 131J between the upper surface 103S of the fin 103 and the uppermost surface of the lower epitaxial cavity 131, e.g., at the bottom of the internal spacer 125S may be about 30-60 nm in one illustrative example. Additionally, the vertical distance between the bottom surface 107A of the isolation structure 107 and the apex 131A of the lower epitaxial cavity 131 may be about 0-40 nm in one illustrative example. In some applications, the bottom surface 107A of the isolation structure 107 may be positioned at a location that is approximately level with a midpoint of the vertical thickness 131G of the lower epitaxial cavity 131.

With continued reference to FIG. 10, after a complete reading of the present application, those skilled in the art will appreciate that the base region of the of the novel BJT device 104 disclosed herein—the N⁻ implant region 111—has a very novel configuration when viewed in a cross-section taken through the base region 111 in a direction corresponding to the base width direction of the lateral BJT device 104. More specifically, an upper lateral width of 111X of the base region 111 at a location near the upper surface 103S of the fin 103 (and below the P+ LDD implant regions 121, if present) is greater than the lower lateral width 111Y of the base region 111 at the bottom 111B of the base region 111 where the base region 111 intersects the N well 109. According to embodiments, in terms of percentages, the lower lateral width 111Y may be about 50% to 95% of the upper lateral width 111X. In general, however, the magnitude of the difference between the dimensions 111X and 111Y may vary depending upon the particular application. The apex 131A of the lower epitaxial cavity 131 may be positioned at a level that is above or below the level of the of the bottom surface 111B of the base region 111. In one particular example, the apex 131A of the lower epitaxial cavity 131 may be positioned at a level that is approximately level with the bottom surface 111B of the base region 111. Also note that the apex 131A of the emitter region 135E and the collector region 135C may, in one embodiment (see FIG. 12), extend under portions of the base region 111.

As will be appreciated by those skilled in the art after a complete reading of the present application, the novel configuration of the base region 111 of the novel lateral BJT device 104 disclosed herein provides significant benefits as compared to prior art lateral BJT devices where the base region of such prior art devices have a substantially uniform width (in the base width direction) throughout the entire vertical height of the base region. In general, with respect to lateral BJT devices, there are two competing operational frequency parameters, namely the cutoff frequency ($f_T$) and the maximum oscillation frequency ($f_{max}$). $f_T$ may be improved (i.e., increased), for example, by providing a base region with a smaller width, which decreases the base transit time. However, since $f_n$ is proportional to the square-root of $f_T/R_B$, where $R_B$ is the resistance of the base region, a higher $f_T$ results in a lower $f_{max}$ and vice-versa. The novel configuration of the base region 111 of the novel lateral BJT device 104 disclosed herein, however, resolves this situation by providing a smaller base width 111Y at the bottom of the base region 111 and a larger base width 111X at the upper part of the base region 111, which results in an increase in $f_T$ and $f_{max}$, as well as an increase in the DC current gain ($\beta$).

Figure 11:
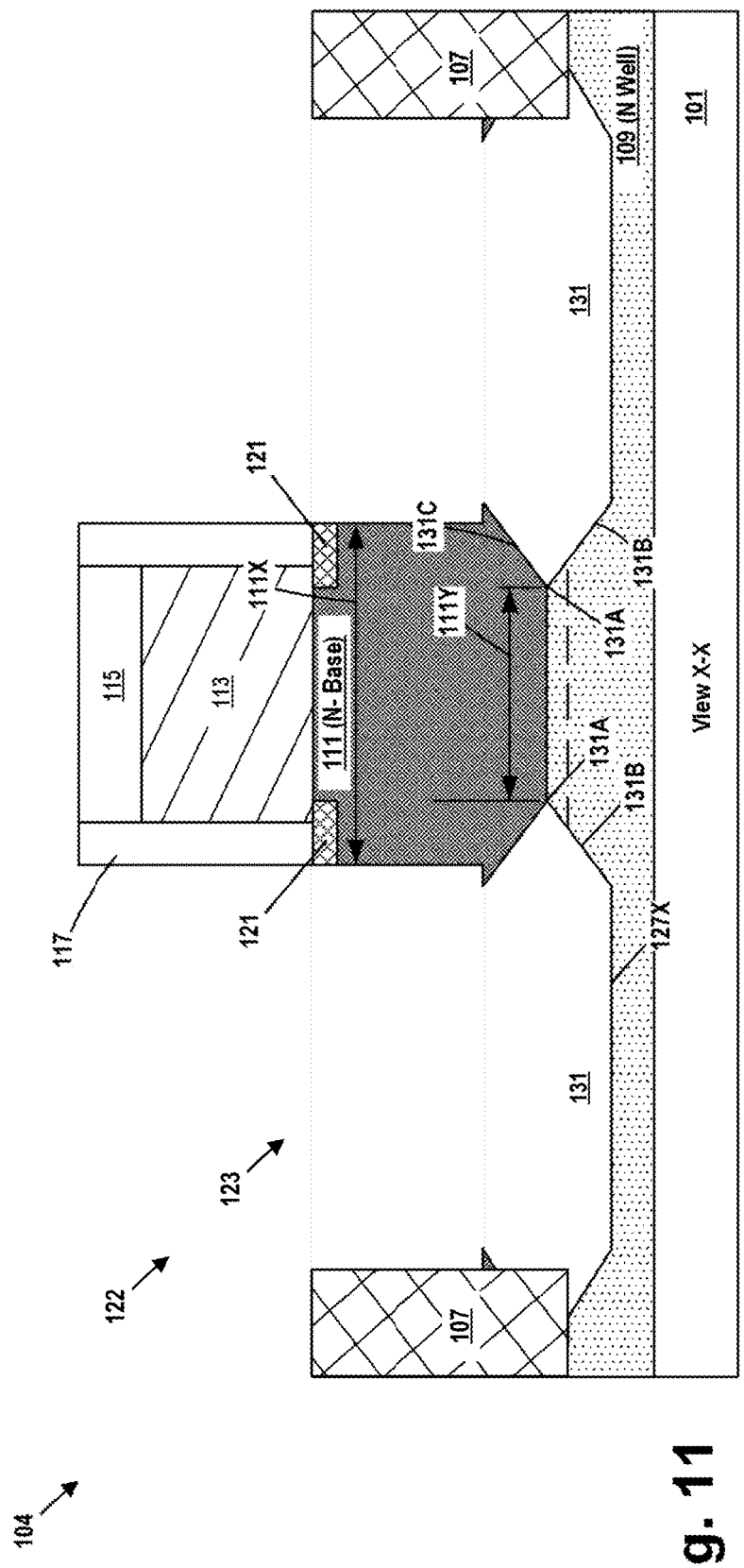

FIG. 11 depicts the IC product 100 after an etching process was performed to remove the internal sidewall spacer 125S from the product 100 and particularly from the overall epitaxial cavities 122.

Figure 12:
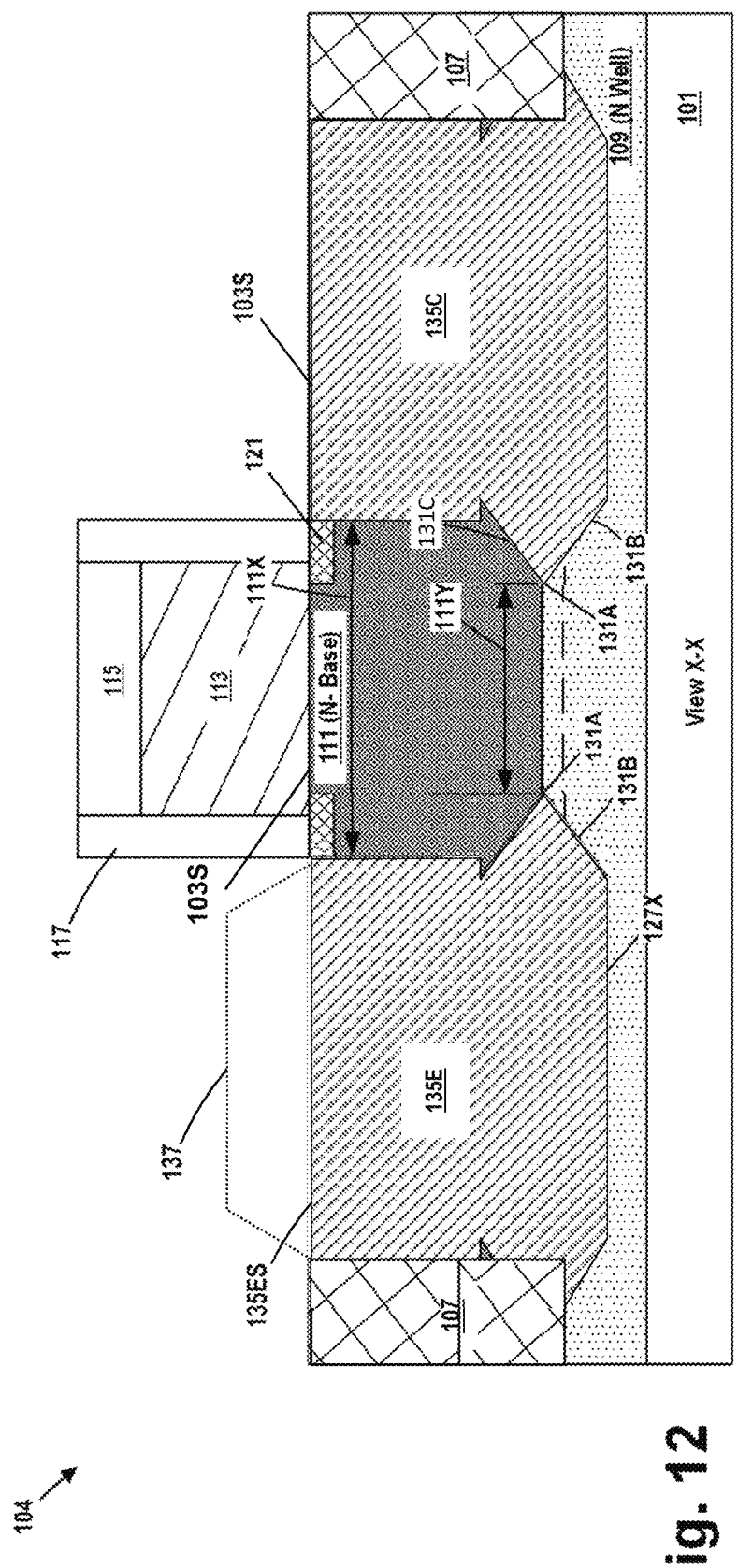

FIG. 12 depicts the IC product after an epitaxial growth process was performed to form regions of P+ doped epi semiconductor material 135E (for the emitter region of the device) and 135C (for the collector region of the device) in the overall epitaxial cavities 122. The regions of P+ doped epi semiconductor material 135E and 135C will be collectively referenced using the numeral 135. In one illustrative process flow, the regions of P+ doped epi semiconductor material 135 may be doped in situ, i.e., dopant materials may be added during the epitaxial growth process. In other applications, the epi semiconductor material 135 may initially be formed as substantially undoped epi semiconductor material and thereafter, an ion implantation process may be performed to introduce the dopant material into the previously undoped epi semiconductor material 135. In this latter case, the dopant concentration of the P+ doped epi semiconductor materials 135E and 135C may be different from one another. Irrespective of how the P-type dopant material is introduced into the epi semiconductor material 135, the dopant concentration of P-type dopant material in the P+ doped epi semiconductor material 135 may vary depending upon the particular application, e.g., $1e^{17}$–$1e^{21}$ atoms/cm$^3$. In one particular embodiment, the dopant concentration of P-type dopant material in the P+ doped epi semiconductor material 135 may be about $1e^{20}$ atoms/cm$^3$. The P+ doped epi semiconductor material 135 may be doped with any species of P-type dopant material. The regions of epi semiconductor material 135 may be made of any desired semiconductor material, e.g. P-doped silicon germanium for an PNP device, N-doped silicon carbon for an NPN device, etc. In the depicted example, the epitaxial growth process is controlled such that the upper surface 135ES of the P+ doped epi semiconductor material 135 is approximately level with the upper surface 103S of the fin 103. In other cases, the P+ doped epi semiconductor material 135 may be grown in such a manner that it has an upper surface 137 (depicted in dashed lines) that is positioned above the upper surface 103S of the fin 103, i.e., raised source/drain regions.

Figure 13:
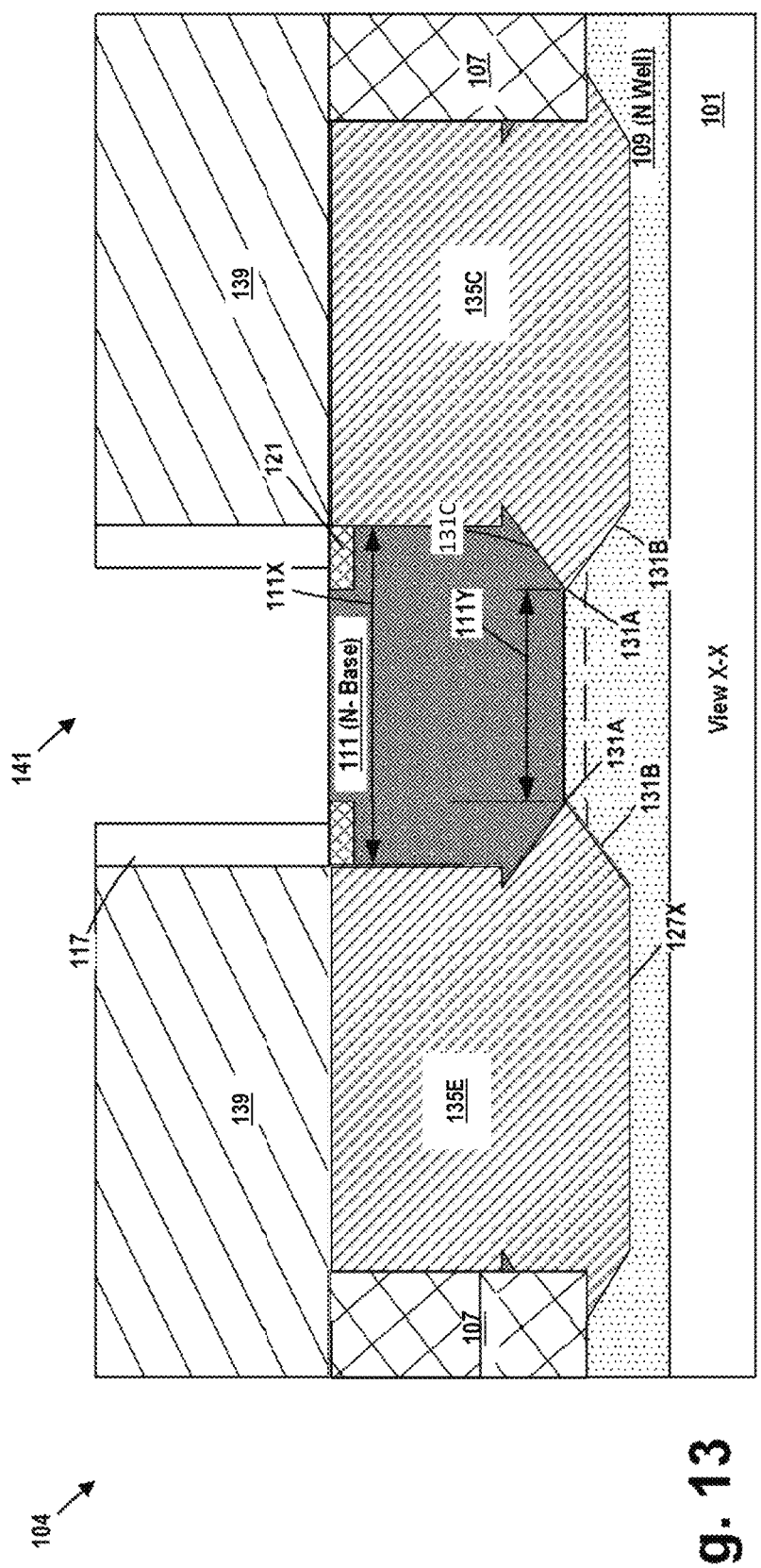

FIG. 13 depicts the IC product 100 after several process operations were performed. First, a layer of insulating material 139, e.g., silicon dioxide, a low-k material, etc., was formed adjacent to the sacrificial the sidewall spacer 117. A conformal etch stop layer (not shown) may be formed prior to forming the layer of insulating material 139. The layer of insulating material 139 may be initially formed such it that covers the gate cap 115. Then, one or more processing steps (e.g., planarization, etching) were performed to remove the sacrificial gate structure 113, thereby forming a base region cavity 141 that exposes the base region 111.

Figure 14:
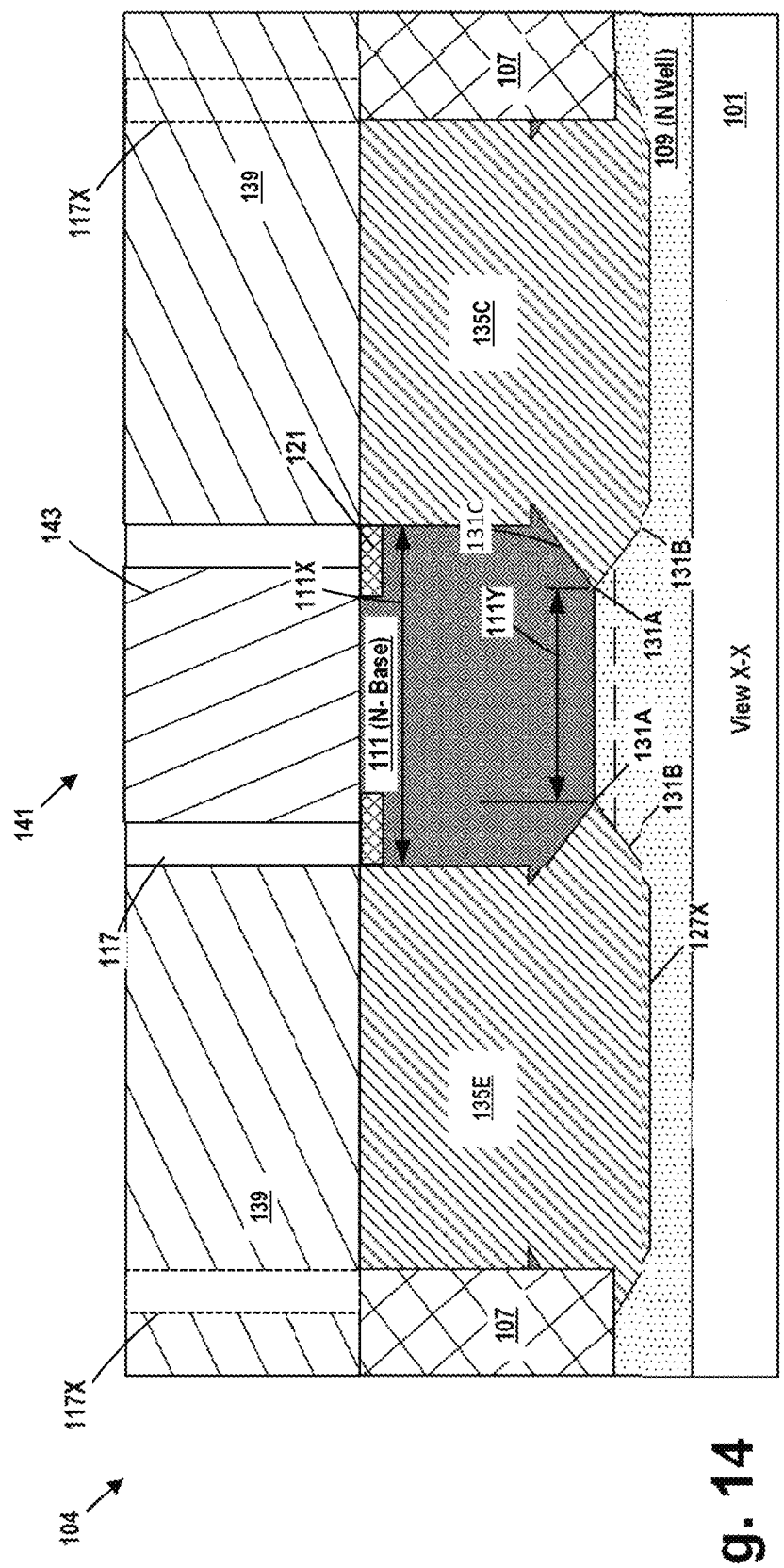

FIG. 14 depicts (in dashed lines) illustrative sidewall spacers 117X that were positioned adjacent sacrificial gate structures (not shown—one to the left of the emitter region 135E and one to the right of the collector region 135C). FIG. 14 depicts the IC product 100 after several process operations were performed. First, another layer of insulating material 143, e.g., silicon dioxide, a low-k material, etc., was formed in the base region cavity 141 and a CMP operation was performed to planarize the upper surface of the layer of insulating material 143. As before, a conformal etch stop layer (not shown) may be formed in the base region cavity 141 prior to the formation of the layer of insulating material 143.

Figure 15:
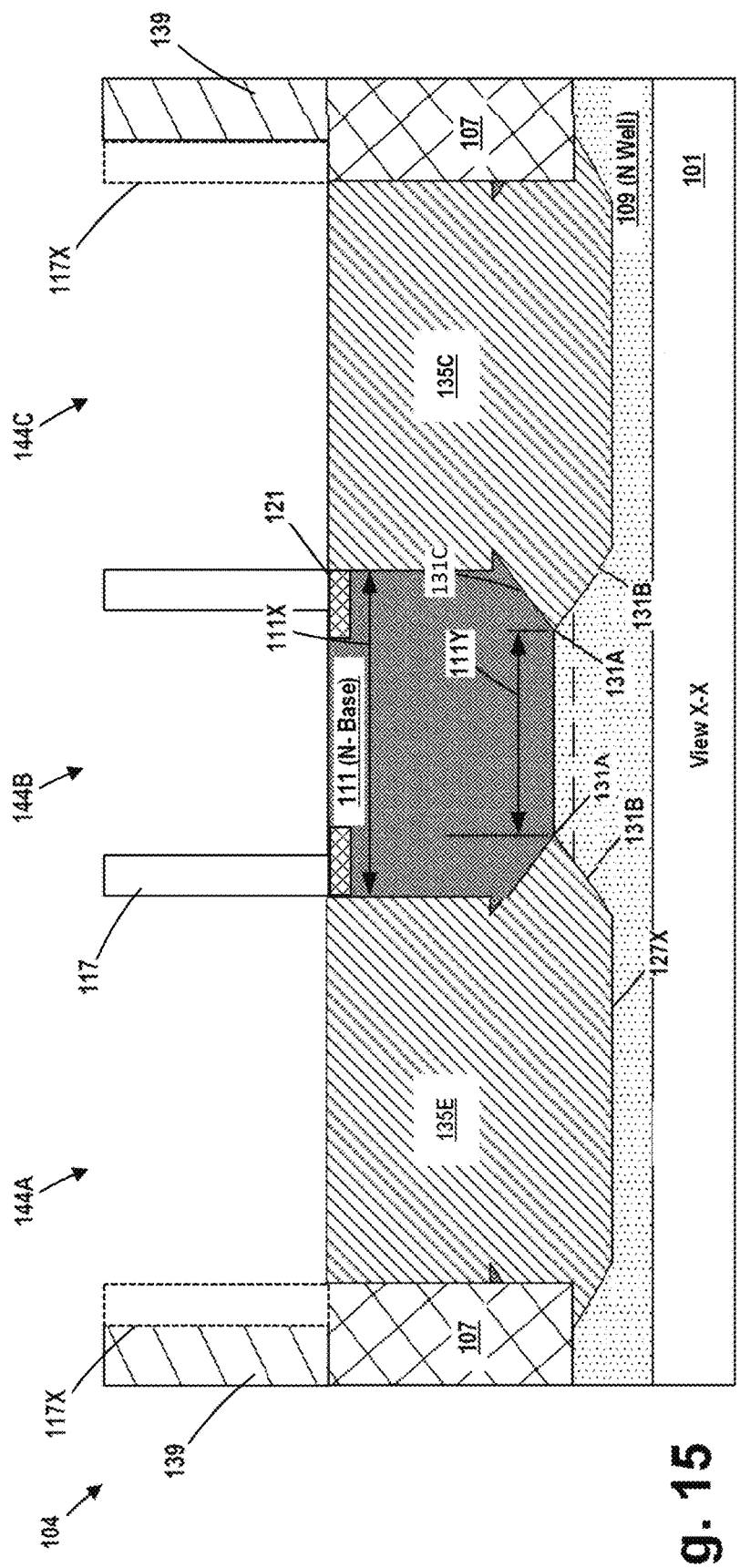

In one illustrative process flow, conductive contact structures for the emitter region 135E, the base region 111, and the collector region 135C of the lateral BJT device 104 may be formed at the same time as other conductive structures (not shown) are formed on the IC product 100 for various transistor devices (not shown). For example, the conductive contact structures for the lateral BJT device 104 may be formed at the same time that conductive source/drain metallization structures (not shown) are formed for contacting the source/drain regions of transistor devices (not shown) on the IC product 100 and they may be made of the same materials as the conductive source/drain metallization structures, e.g., a trench silicide material. Accordingly, FIG. 15 depicts the IC product 100 after an etching process was performed to form contact openings 144A, 144B and 144C (collectively referenced using the numeral 144) that expose the emitter region 135E, the base region 111 and the collector region 135C, respectively, of the lateral BJT device 104.

Figure 16:
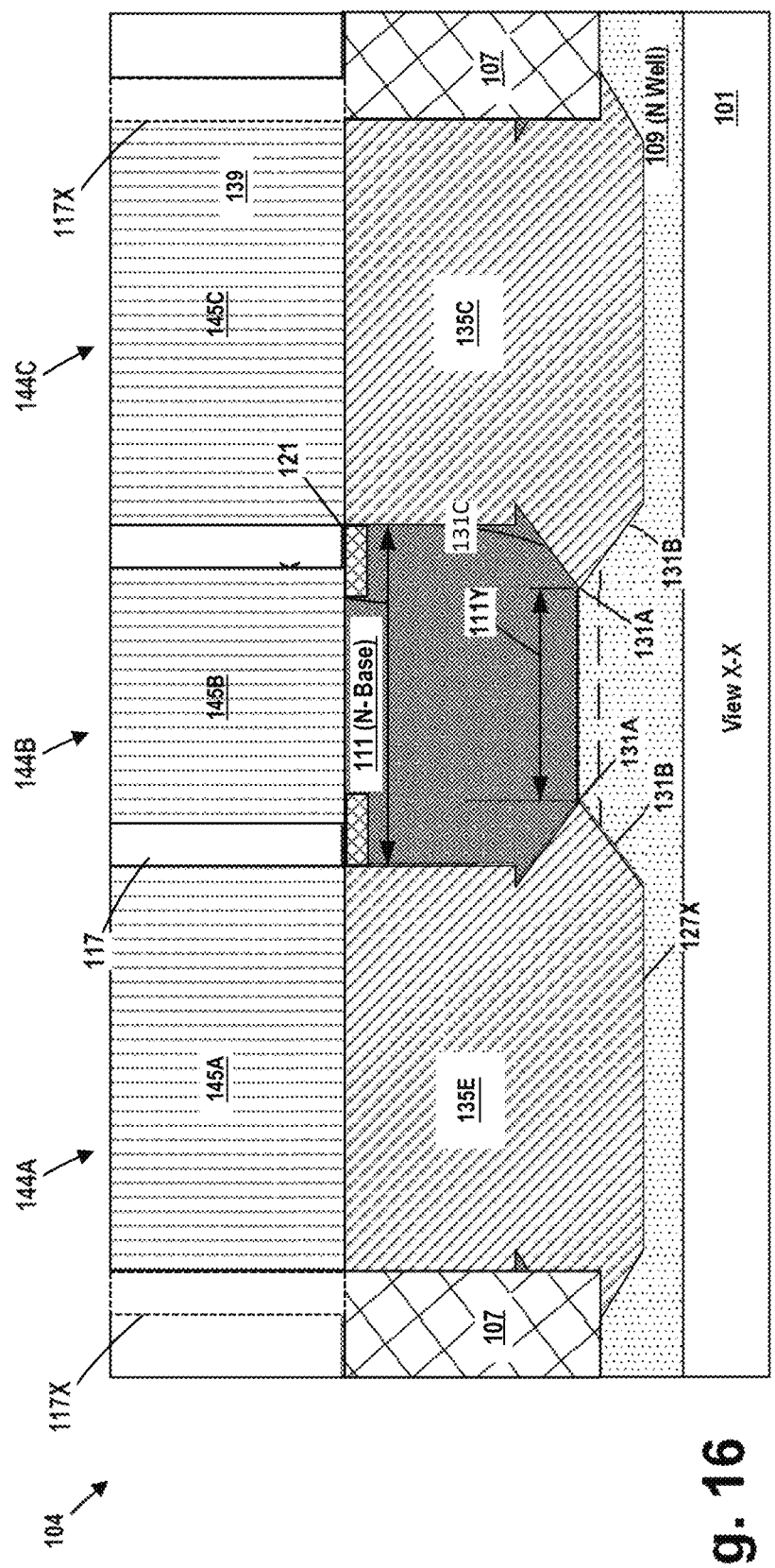

FIG. 16 depicts the IC product 100 after illustrative conductive contact structures 145A, 145B and 145C (collectively referenced using the numeral 145) were formed to conductively contact the emitter region 135E, the base region 111 and the collector region 135C, respectively, of the lateral BJT device 104. As noted above, the conductive contact structures 145 may be comprised of the same materials and formed at the same time as the conductive source/drain metallization structures, e.g., a trench silicide material, formed elsewhere on the IC product 100. All of the conductive contact structures 145 need not be of the same physical size, but that may be the case in some applications. Note that, in this illustrative process flow, the conductive contact structures 145 are formed in a self-aligned manner between the spacer structures 117.

It should also be noted that the conductive contact structures 145 may also be formed by performing traditional manufacturing processes, e.g., etching contact openings in the insulating materials 139, 141, that expose at least a portion of the emitter region 135E, the base region 111 and the collector region 135C, deposition of liner layers and conductive material in the contact openings and performing a CMP operation to remove conductive material positioned outside of the contact openings and above the upper surface of the insulating materials 139, 141.

Figure 17:
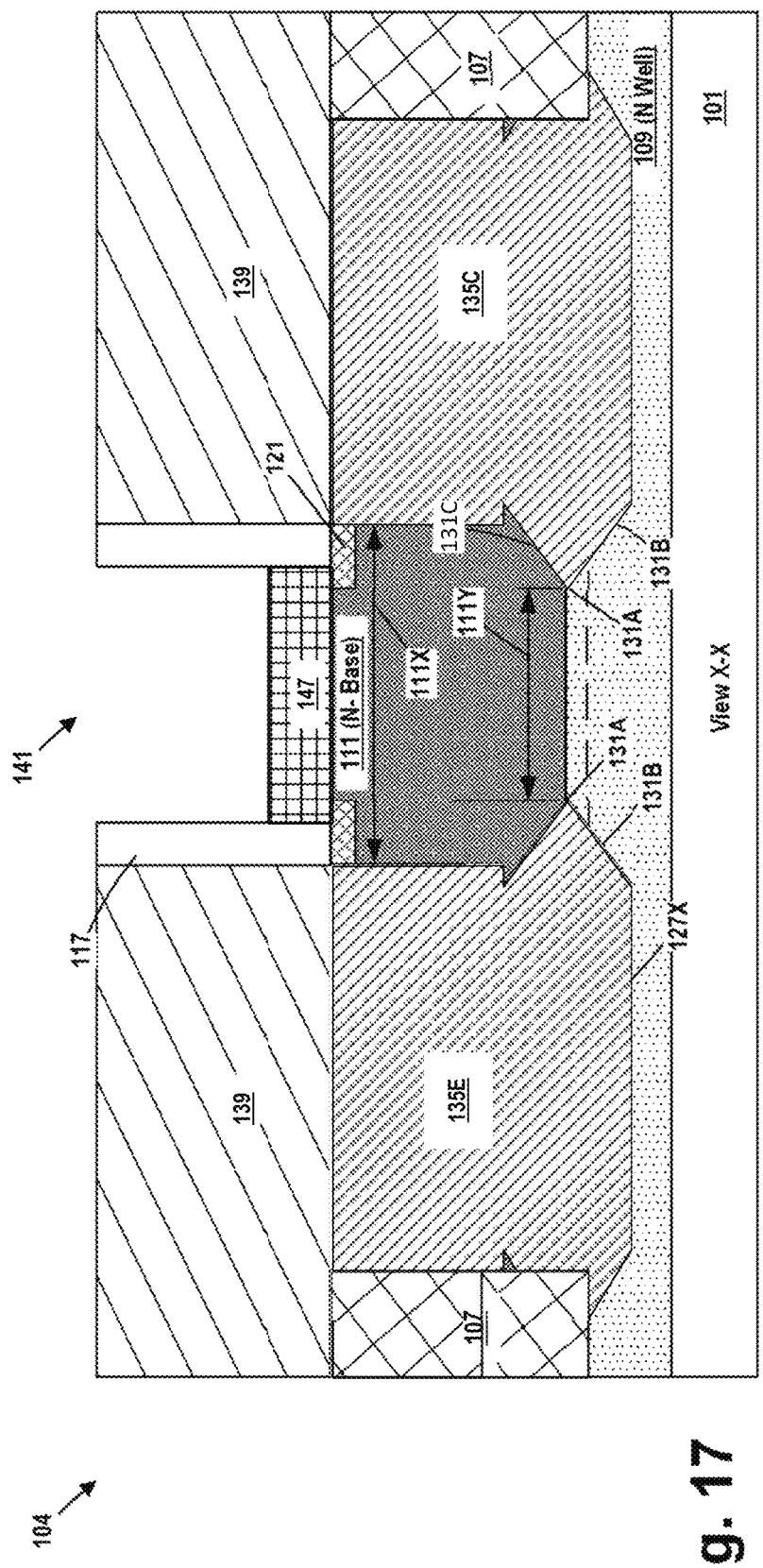
Figure 18:
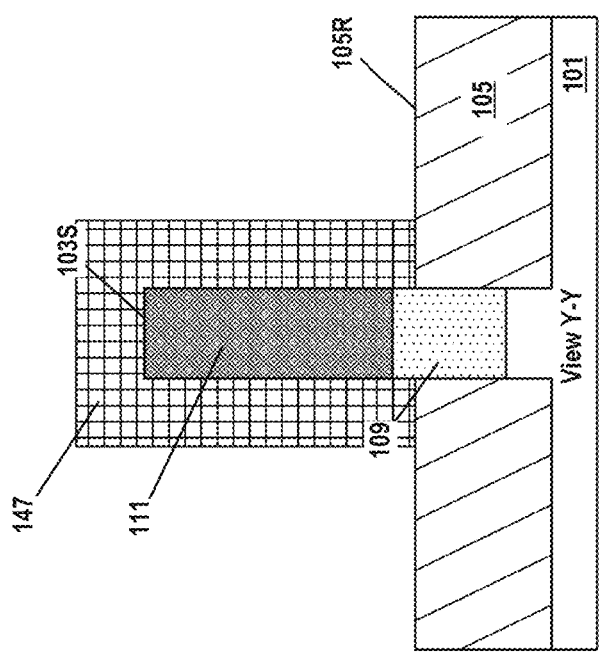

FIG. 17 (view X-X) and FIG. 18 (view Y-Y) depict an alternative embodiment of the novel the lateral BJT device 104 disclosed herein. Starting from the point of manufacturing shown in FIG. 13, i.e., after formation of the base region cavity 141, FIGS. 17 and 18 depict the IC product 100 after an epitaxial growth process was performed to form a region of N+doped epi semiconductor material 147 in the base region cavity 141 between the sidewall spacer 117 and on the base region 111. This additional epi semiconductor material 147 is part of the overall base region for the lateral BJT device 104 and the epi semiconductor material 147 may be referred to an extrinsic (or additional) base region as it adds to the physical volume to the base region 111 that was formed in the fin 103 via ion implantation, which may be referred to as an intrinsic (or initial) base region. In one illustrative process flow, the epi semiconductor material 147 may be doped in situ, i.e., dopant materials may be added during the epitaxial growth process. In other applications, the epi semiconductor material 147 may initially be formed as substantially undoped epi semiconductor material and thereafter, an implantation process may be performed to introduce the dopant material into the previously undoped epi semiconductor material 147. Irrespective of how the N-type dopant material is introduced into the epi semiconductor material 147, the dopant concentration of N-type dopant material in the N+ doped epi semiconductor material 147 may vary depending upon the particular application, e.g., $1e^{19}$–$1e^{21}$ atoms/cm$^3$. In one particular embodiment, the dopant concentration of N-type dopant material in the N+ doped epi semiconductor material 147 may be about $1e^{20}$ atoms/cm$^3$. The N+ doped epi semiconductor material 147 may be doped with any species of N-type dopant material. The regions of epi semiconductor material 147 may be made of any desired semiconductor material, e.g. N-doped silicon carbon for an PNP device, P-doped silicon germanium for an NPN device, etc. The volume of the epi semiconductor material 147 that is formed may also vary depending upon the particular application. In one illustrative embodiment, the epi semiconductor material 147 that forms on the exposed upper and side surfaces if the fin 103 may a substantially uniform thickness.

Figure 19:
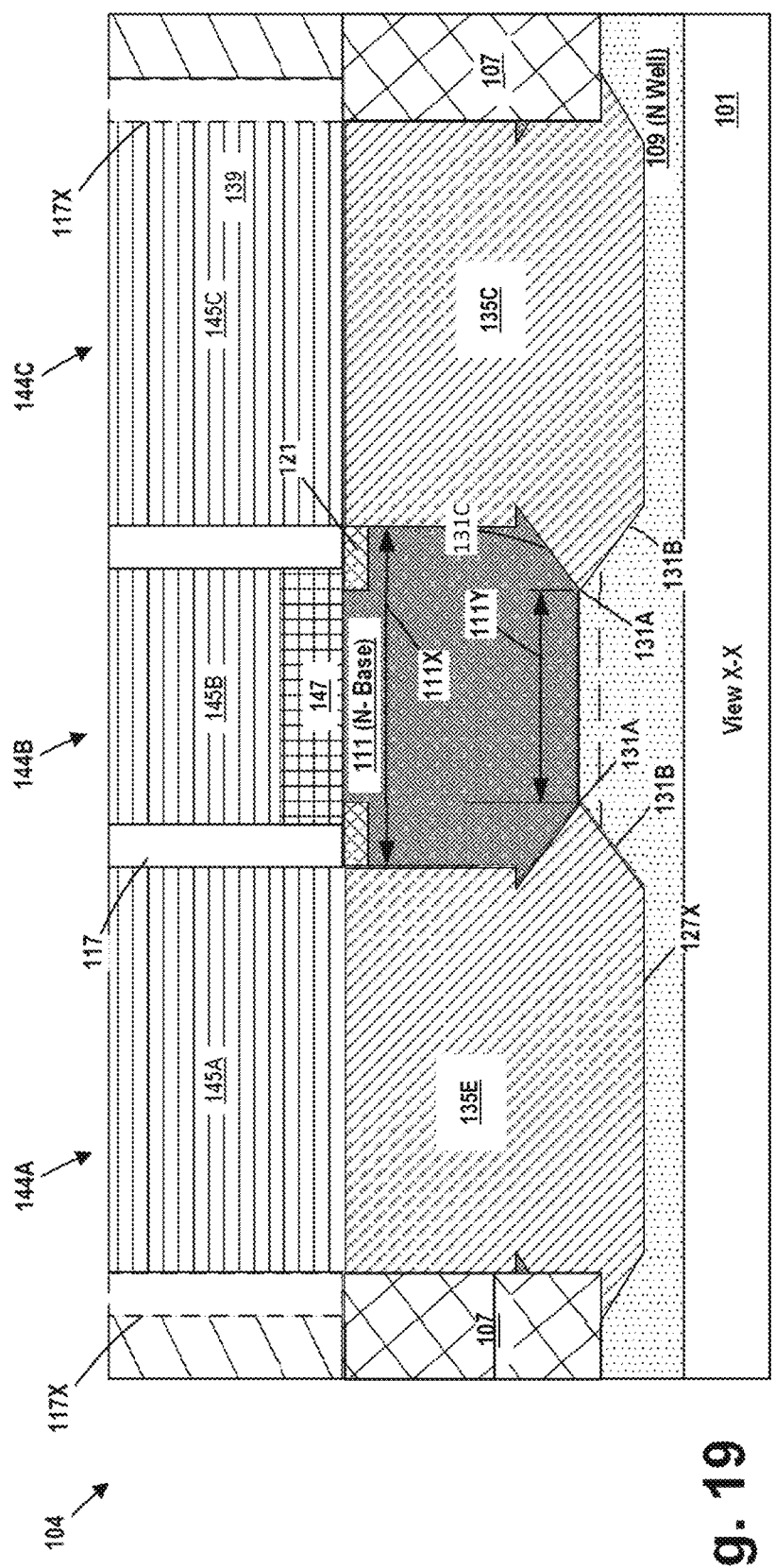

FIG. 19 depicts the IC product 100 after the above-described conductive contact structures 145 were formed on the lateral BJT device 104.

Figure 20:
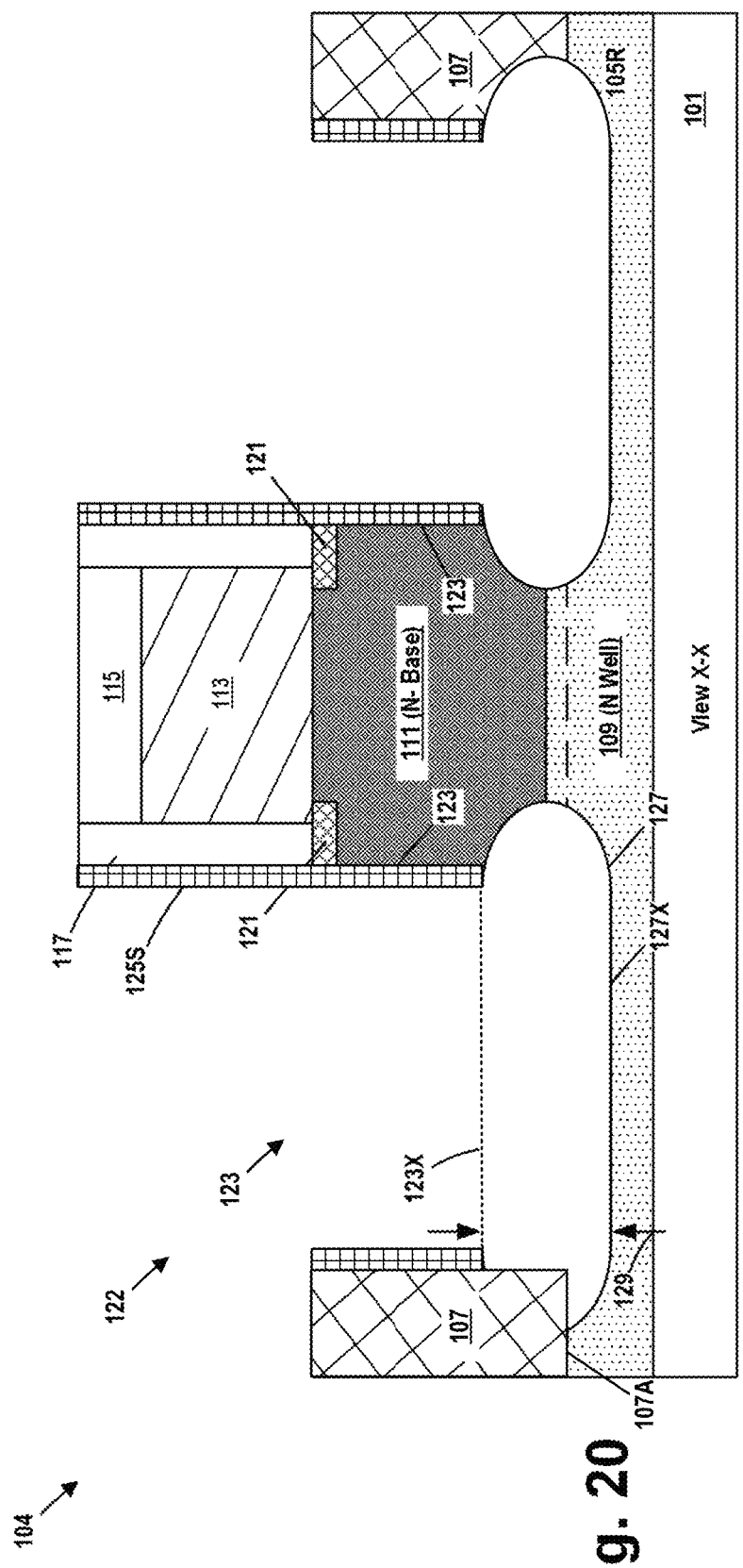
Figure 21:
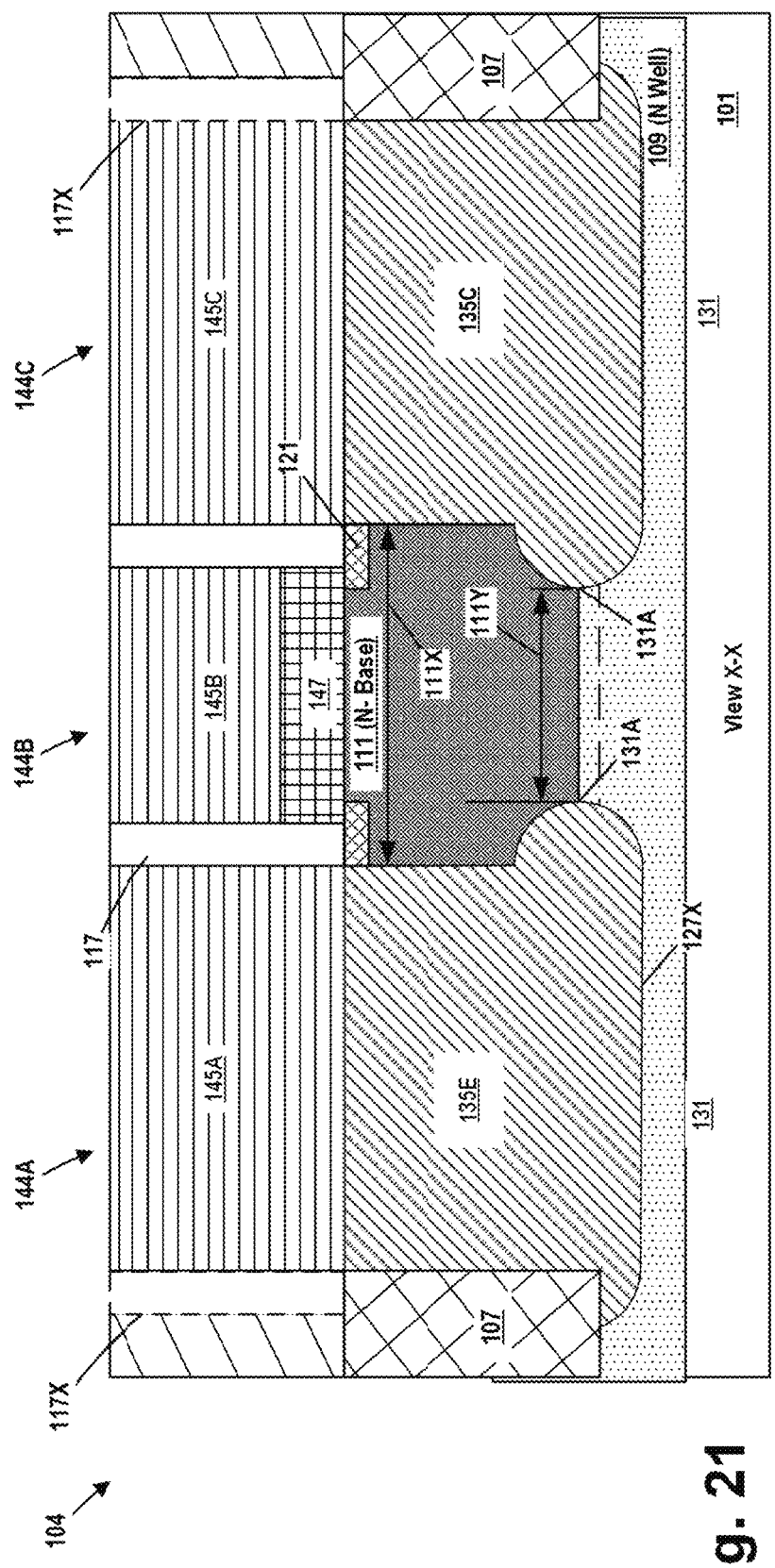

As noted above, the overall epitaxial cavity 122 (e.g., the combination of the lower epitaxial cavity 131 and upper epitaxial cavity 123) may have a variety of different configurations. FIGS. 20-21 depict another illustrative embodiment of the lateral BJT device 104 wherein the lower epitaxial cavity 131 of the overall epitaxial cavity 122 has a generally rounded or oval configuration. In one particular example, the oval or rounded lower epitaxial cavity 131 may have dimensions substantially similar to those described above for the sigma-shaped (or diamond-shaped) lower epitaxial cavity 131. In some applications, the bottom surface 107A of the isolation structure 107 may be positioned at a location that is approximately level with a midpoint of the vertical thickness 129 of the oval or rounded lower epitaxial cavity 131 shown in FIG. 20.

With reference to FIG. 20, after formation of the internal sidewall spacers 125S in the upper epitaxial cavities 123 (see FIG. 9), one or more etching processes were performed to form the oval or rounded lower epitaxial cavity 131. The etching process(es) used to form the lower epitaxial cavity 131 may have both isotropic and anisotropic characteristics. The overall size of the rounded lower epitaxial cavity 131 may vary depending upon the particular application FIG. 21 depicts the IC product 100 after the above-described emitter region 135, the collector region 135C, the epi semiconductor material 147 and the conductive contact structures 145 were formed on the lateral BJT device 104. As with the previous embodiment, the epi semiconductor material 147 may be omitted if desired.

Figure 22:
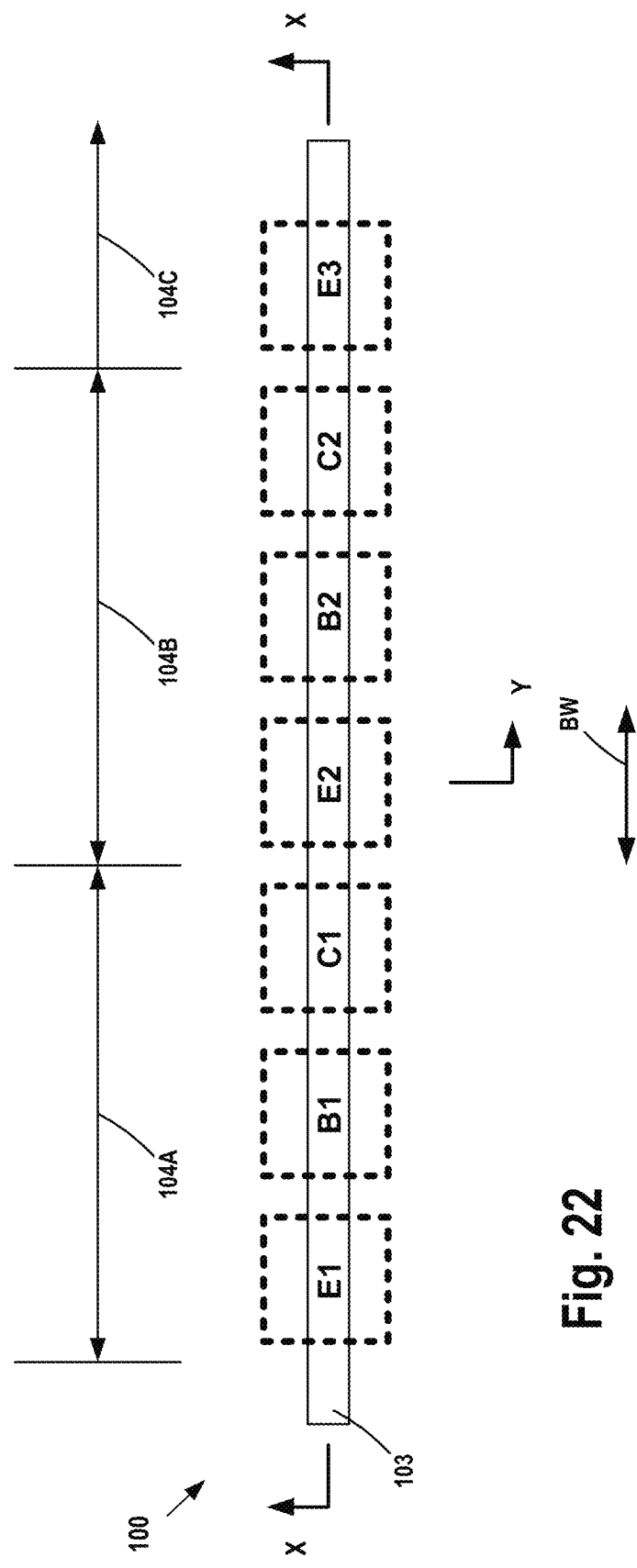

The above-described drawings depict the formation of a single lateral BJT device 104 that is surrounded by the isolation structure 107. In practice, several of such lateral BJT devices 104 may be formed laterally adjacent one another and the isolation structure 107 may be positioned around the entire group of the lateral BJT devices 104. FIG. 22 is a simplistic plan view showing the formation of three lateral BJT devices 104A, 104B and 104C (partial), collectively referenced using the numeral 104. The lateral BJT device 104A comprises emitter region 1 (E1), base region 1 (B1) and collector region 1 (C1). The lateral BJT device 104B comprises emitter region 2 (E2), base region 2 (B2) and collector region 2 (C2). Only the emitter region 3 (E3) and the base region (B3) of the lateral BJT device 104C are depicted.

Figure 23:
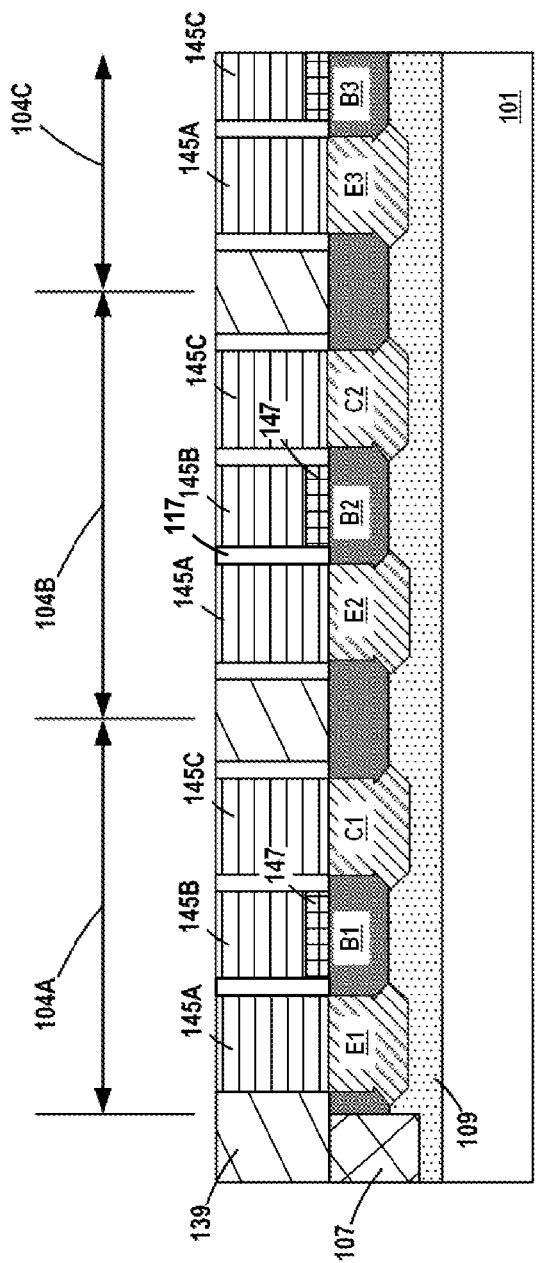
Figure 24:
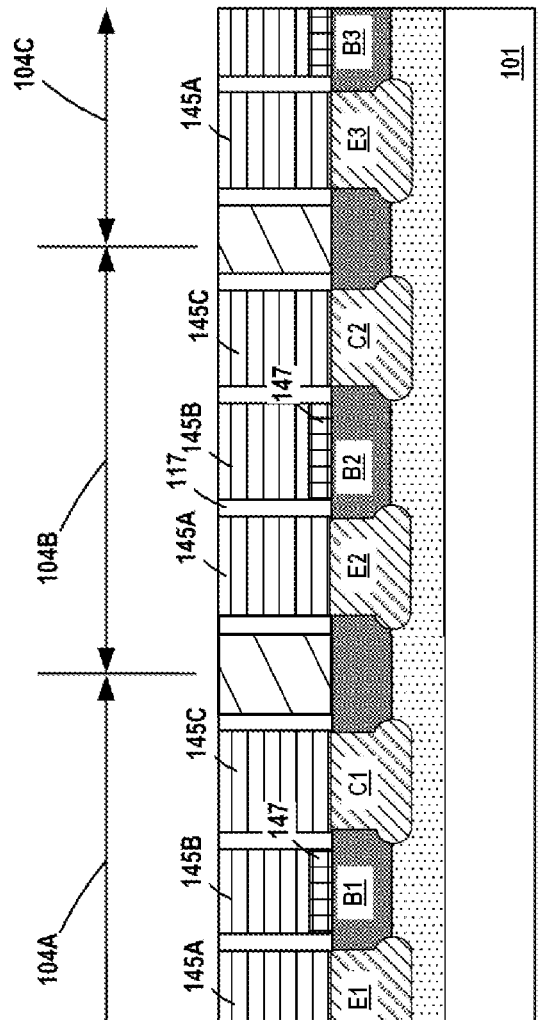

FIG. 23 is a cross-sectional view of the illustrative the lateral BJT devices 104 shown in FIG. 22 wherein the lower epitaxial cavity 131 of the overall epitaxial cavity 122 has a sigma-shaped (or diamond-shaped) lower epitaxial cavity 131. FIG. 24 is a cross-sectional view of the illustrative the lateral BJT devices 104 shown in FIG. 22 wherein the lower epitaxial cavity 131 of the overall epitaxial cavity 122 has a generally rounded or oval configuration. FIGS. 23 and 24 do not contain all of the details shown in the previous cross-sectional views, e.g., the P$^+$ LDD implant regions 121 are omitted, etc., so as not to overly complicate FIGS. 23 and 24.

Simulations have been performed that demonstrate that the novel, non-uniform base lateral BJT device 104 shown in FIG. 19 (hereafter referred to as the NUBW BJT 104) with a doped extrinsic base epi semiconductor material 147 and a base region 111 with the differing upper and lower lateral widths 111X, 111Y, respectively, exhibits significant performance capabilities as compared to a corresponding the lateral BJT device with a corresponding doped extrinsic base epi semiconductor material with a base region having a substantially uniform lateral width (in the base width direction) for substantially the entire vertical height of the uniform width base region (hereafter referred to as a uniform base width BJT device" (UBW BJT device). For purposes of the simulation, both the NUBW BJT 104 and the UBW BJT device were modeled as PNP devices. Additionally, the upper lateral width of 111X and the lower lateral width 111Y of the base region 111 of the NUBW BJT 104 were 20 nm and 10 nm, respectively, while the UBW BJT device had a uniform base width (in the base width direction) of about 20 nm. In addition, the doping levels in all of the various regions, e.g., the well regions, the collector and emitter regions, etc., were substantially the same.

Figure 25:
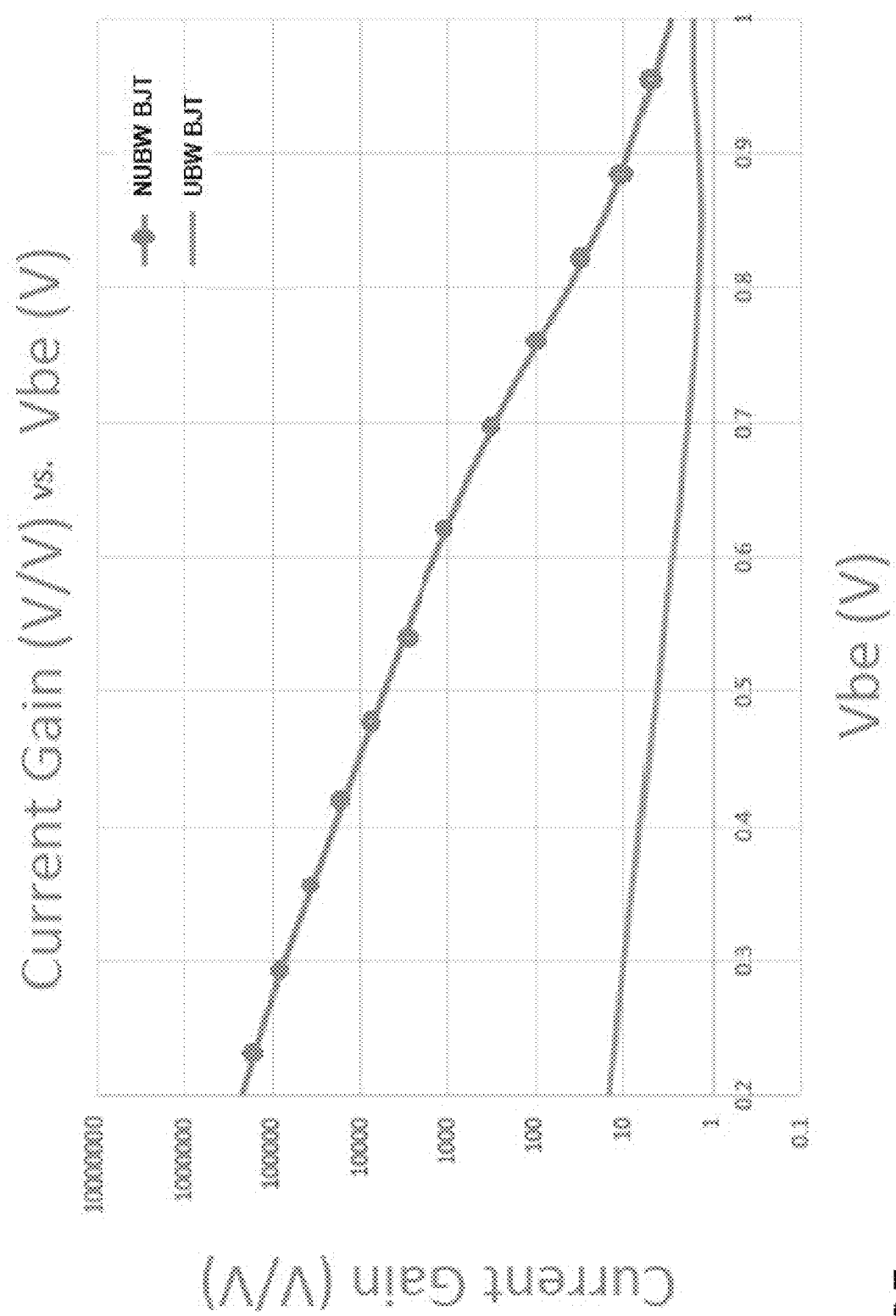
Figure 26:
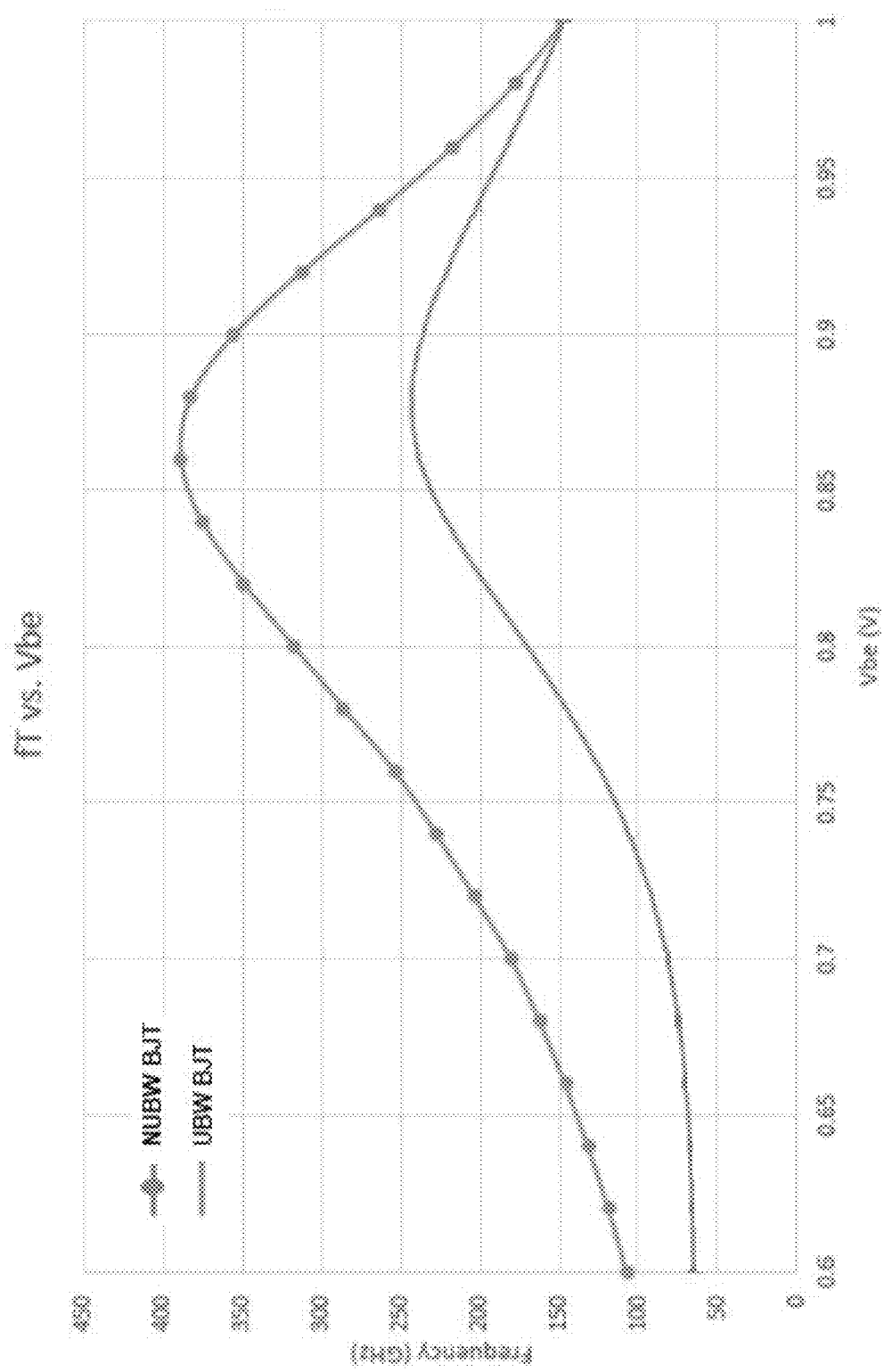
Figure 27:
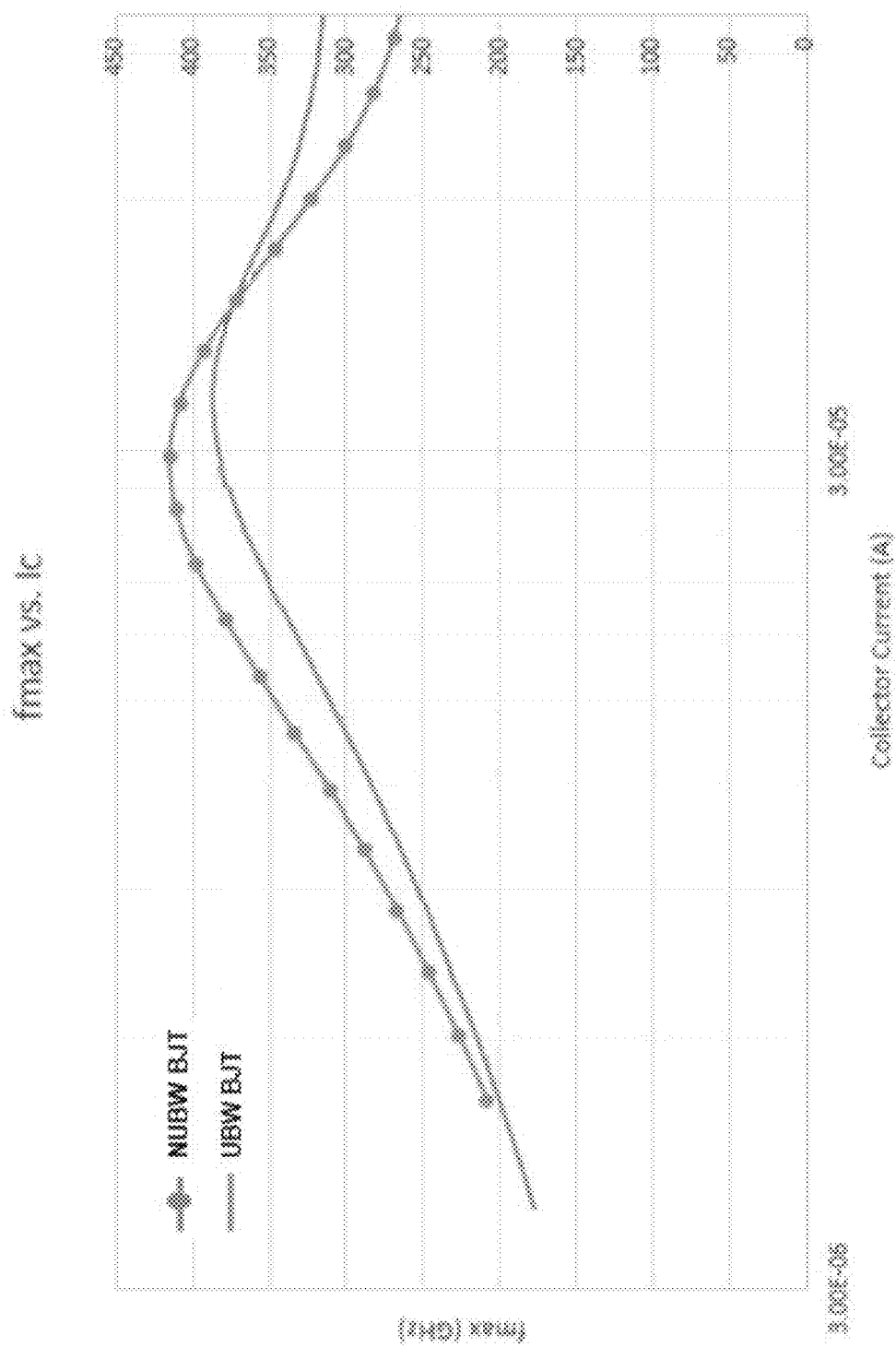

FIG. 25-27 are graphs depicting the comparison of various performance parameters of the NUBW BJT 104 shown in FIG. 19 as compared to a UBW BJT device.

FIG. 25 is a plot of current gain ($\beta$) versus the voltage across the base-emitter (Vbe) for the NUBW BJT 104 and the UBW BJT device. From this graph it can be seen that the current gain ($\beta$) of the NUBW BJT 104 is significantly increased relative to the UBW BJT device. For example, the $\beta$ of the NUBW BJT 104 shown in FIG. 19 is about one hundred times greater than the $\beta$ for the UBW BJT device at the point where Vbe=about 0.7V.

FIG. 26 is a plot of the cut-off frequency ($f_T$) of the NUBW BJT 104 according to embodiments and a UBW BJT device versus the voltage across the base-emitter (Vbe). From this graph it can be seen that the $f_T$ of the NUBW BJT 104 is significantly increased relative to the $f_T$ of the UBW BJT device. For example, the $f_T$ of the NUBW BJT 104 shown in FIG. 19 is about one hundred percent greater than the $f_T$ for the UBW BJT device at the point where Vbe=about 0.7V.

FIG. 27 is a plot of the maximum oscillation frequency ($f_{max}$) of the NUBW BJT 104 according to embodiments and a UBW BJT device versus the collector current. From this graph it can be seen that the $f_{max}$ of the NUBW BJT 104 is significantly increased relative to the $f_{max}$ of the UBW BJT device. For example, the fmax of the NUBW BJT 104 shown in FIG. 19 is about 15% greater than the $f_{max}$ of the UBW BJT device. In general, fmax is improved across the typical collector current range.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
a semiconductor substrate, the semiconductor substrate having an upper surface; and
a bipolar junction transistor (BJT) device, the BJT device comprising a collector region, a base region, and an emitter region positioned in the semiconductor substrate,
the base region being positioned between the collector region and the emitter region; the base region comprising a top surface and a bottom surface, wherein a first width of the top surface of the base region in a base width direction of the BJT device is greater than a second width of the bottom surface of the base region in the base width direction of the BJT device,
wherein the collector region comprises an epitaxial (epi) semiconductor material formed within a first cavity and the emitter region comprises an epi semiconductor material formed within a second cavity, wherein a section of the first cavity and a section of the second cavity extend under portions of the base region.

2. The device of claim 1, wherein the top surface of the base region is positioned at the upper surface of the semiconductor substrate.

3. The device of claim 1, wherein the BJT device is one of an NPN BJT device or a PNP BJT device.

4. The device of claim 1, wherein the semiconductor substrate comprises a fin structure, wherein at least a portion of the collector region, the base region, and the emitter region are positioned in the fin structure, and wherein the upper surface of the semiconductor substrate is an upper surface of the fin structure.

5. The device of claim 1, wherein the section of the first cavity and the section of the second cavity are separated by a distance equal to the second width of the bottom surface of the base region in the base width direction of the BJT device.

6. The device of claim 1, wherein the second width is about 50-95% of the first width.

7. A lateral bipolar junction transistor (BJT) device, comprising:
a collector region, a base region, and an emitter region positioned in a semiconductor substrate, the base region being positioned between the collector region and the emitter region;
the base region comprising a top surface and a bottom surface, wherein a first width of the top surface of the base region in a base width direction of the lateral BJT device is greater than a second width of the bottom surface of the base region in the base width direction of the lateral BJT device,
wherein a section of the collector region and a section of the emitter region extend under portions of the base region and are separated by a distance equal to the second width, and
wherein the collector region comprises an epitaxial (epi) semiconductor material formed within a first cavity and the emitter region comprises an epi semiconductor material formed within a second cavity, wherein a section of the a first cavity and a section of the second cavity extend under the portions of the base region.

8. The lateral BJT device of claim 7, wherein the top surface of the base region is positioned at the upper surface of the semiconductor substrate.

9. The lateral BJT device of claim 7, wherein the BJT device is one of an NPN BJT device or a PNP BJT device.

10. The lateral BJT device of claim 7, wherein the semiconductor substrate comprises a fin structure, wherein at least a portion of the collector region, the base region, and the emitter region are positioned in the fin structure, and wherein the upper surface of the semiconductor substrate is an upper surface of the fin structure.

11. The lateral BJT device of claim 7, wherein the second width is about 50-95% of the first width.

12. A method, comprising:
providing a semiconductor substrate, the semiconductor substrate having an upper surface;
forming a bipolar junction transistor (BJT) device in the semiconductor substrate, the BJT device comprising a collector region, a base region, and an emitter region positioned in the semiconductor substrate, the base region being positioned between the collector region and the emitter region and including a top surface and a bottom surface;
forming the collector region within a first cavity in the semiconductor substrate; and
forming the emitter region within a second cavity in the semiconductor substrate,
wherein a section of the a first cavity and a section of the second cavity extend under portions of the base region, and
wherein a first width of the top surface of the base region in a base width direction of the BJT device is greater than a second width of the bottom surface of the base region in the base width direction of the BJT device.

13. The method of claim 12, wherein the semiconductor substrate comprises a fin structure, the method further comprising positioning at least a portion of the collector region, the base region, and the emitter region in the fin structure, wherein the upper surface of the semiconductor substrate is an upper surface of the fin structure.

14. The method of claim 12, further comprising forming an epitaxial (epi) semiconductor material within the first and second cavities.

15. The method of claim 12 wherein the section of the first cavity and the section of the second cavity are separated by a distance equal to the second width of the bottom surface of the base region in the base width direction of the BJT device.

16. The method of claim 12, wherein the second width is about 50-95% of the first width.

* * * * *